US007006549B2

(12) United States Patent
Anikitchev et al.

(10) Patent No.: US 7,006,549 B2
(45) Date of Patent: Feb. 28, 2006

(54) APPARATUS FOR REDUCING SPACING OF BEAMS DELIVERED BY STACKED DIODE-LASER BARS

(75) Inventors: Serguei G. Anikitchev, Belmont, CA (US); R. Russel Austin, Half Moon Bay, CA (US)

(73) Assignee: Coherent, Inc., Santa Clara, CA (US)

( * ) Notice: Subject to any disclaimer, the term of this patent is extended or adjusted under 35 U.S.C. 154(b) by 258 days.

(21) Appl. No.: 10/459,281

(22) Filed: Jun. 11, 2003

(65) Prior Publication Data

US 2004/0252743 A1 Dec. 16, 2004

(51) Int. Cl.
*H01S 3/082* (2006.01)
(52) U.S. Cl. ......................................... 372/97; 372/107
(58) Field of Classification Search ................... 372/75, 372/69, 100, 107, 70, 79, 97
See application file for complete search history.

(56) References Cited

U.S. PATENT DOCUMENTS

| 4,978,197 | A |   | 12/1990 | Horikawa .................... 350/174 |
| 5,155,623 | A |   | 10/1992 | Miller et al. ................. 359/495 |
| 5,258,989 | A |   | 11/1993 | Raven ............................ 372/6 |
| 5,513,201 | A |   | 4/1996 | Yamaguchi et al. ........... 372/75 |
| 5,650,873 | A |   | 7/1997 | Gal et al. ..................... 359/487 |
| 5,798,877 | A |   | 8/1998 | Nightingale et al. ......... 359/831 |
| 5,946,130 | A | * | 8/1999 | Rice ............................ 359/349 |
| 6,005,717 | A |   | 12/1999 | Neuberger et al. ........... 359/619 |
| 6,064,528 | A |   | 5/2000 | Simpson, Jr. ................ 359/619 |
| 6,151,342 | A |   | 11/2000 | Nightingale et al. .......... 372/36 |
| 6,175,452 | B1 |  | 1/2001 | Ullmann et al. ............. 359/641 |
| 6,212,216 | B1 |  | 4/2001 | Pillai ............................ 372/96 |
| 6,229,831 | B1 |  | 5/2001 | Nightingale et al. .......... 372/36 |
| 6,337,873 | B1 |  | 1/2002 | Goering et al. ............... 372/69 |
| 6,356,577 | B1 | * | 3/2002 | Miller ......................... 372/107 |
| 6,411,323 | B1 |  | 6/2002 | Waarts et al. ................ 347/241 |
| 6,556,352 | B1 |  | 4/2003 | Wang et al. ................. 359/641 |
| 6,680,800 | B1 |  | 1/2004 | Schreiber et al. ........... 359/618 |
| 6,683,727 | B1 |  | 1/2004 | Göring et al. .............. 359/639 |
| 6,785,440 | B1 |  | 8/2004 | Lawrenz-Stolz ............. 385/33 |
| 6,851,610 | B1 |  | 2/2005 | Knowles et al. ....... 235/462.01 |
| 2004/0067016 | A1 |  | 4/2004 | Anikitchev et al. ........... 385/34 |

(Continued)

FOREIGN PATENT DOCUMENTS

DE 200 10 309 U1 6/2000

(Continued)

OTHER PUBLICATIONS

"Uniform Line Illumination with Small Area High Radiant Sources," *IBM Technical Disclosure Bulletin*, vol. 35, No. 3, Aug. 1992, 2 pages in length.

(Continued)

*Primary Examiner*—Minsun Harvey
*Assistant Examiner*—Dung (Michael) T. Nguyen
(74) *Attorney, Agent, or Firm*—Stallman & Pollack LLP

(57) ABSTRACT

Two parallel sets of groups of beams from diode laser bars are spaced apart by a distance V. The two sets of beam groups are interleaved by a beam combiner to provide on set of beam groups spaced apart by a distance V/2. The beam combiner includes a plurality of reflective strips in a plane inclined to the direction of propagation of the beam groups. One set of beam groups is transmitted through the beam combiner without being intercepted by the reflective strips. The other set of beam groups is interleaved with the transmitted set of beam groups by reflecting the other set of beam groups from the reflective strips.

28 Claims, 14 Drawing Sheets

U.S. PATENT DOCUMENTS

2004/0091013 A1 5/2004 Yamaguchi et al. ........ 372/108
2004/0091209 A1 5/2004 Mikhailov ................... 385/31

FOREIGN PATENT DOCUMENTS

| DE | 101 13 019 A1 | 3/2001 |
|----|---------------|--------|
| EP | 0 984 312 A2 | 8/1999 |
| EP | 1 143 584 A2 | 10/2001 |
| JP | 2002-148562 | 5/2002 |
| WO | WO 99/35724 | 7/1999 |
| WO | WO 00/57229 | 9/2000 |
| WO | WO 00/60399 | 10/2000 |
| WO | WO 01/27686 A1 | 4/2001 |

OTHER PUBLICATIONS

J.D. Minelly et al., "Diode-Array Pumping of $Er^{3+}/Yb^{3+}$ Co-Doped Fiber Lasers and Amplifiers," *IEEE Photonics Technology Letters*, vol. 5, No. 3, Mar. 1993, pp. 301-303.

U.S. Appl. No. 10/266,066, filed Oct. 7, 2002, by Serguei Anikitchev and Mathew Rekow, entitled: Method and Apparatus for Coupling Radiation from a Stack of Diode-Laser Bars into a Single-Core Optical Fiber, 53 pages in length.

\* cited by examiner

APPARATUS FOR REDUCING SPACING OF BEAMS DELIVERED BY STACKED DIODE-LASER BARS

TECHNICAL FIELD OF THE INVENTION

The present invention relates in general to linear arrays of diode-lasers, generally referred to as diode-laser bars. The invention relates in particular to the use of a patterned mirror for concentrating the output of a stack of such diode-laser bars.

DISCUSSION OF BACKGROUND ART

Laser-radiation from diode-laser arrays is frequently used for tasks such as heating material for surface treatment, and optically pumping solid-state lasers. The diode-laser array may be a one-dimensional (linear) array or a two-dimensional array. Typically, a one-dimensional array of diode-lasers is made by forming a plurality of diode-lasers (emitters) in a common substrate. This is commonly referred to as a diode-laser bar. A plurality of such bars can be stacked to form a two-dimensional diode-laser array.

Typically, a diode-laser bar for providing laser-radiation having a wavelength of between about 800 and 1000 nanometers (nm) is about 10 millimeters (mm) long, about 1 mm wide and may include between about 2 and 50 individual emitters, spaced-apart along the diode-laser bar. The emitters have a rectangular emitting-aperture about 1 micrometer ($\mu$m) high and between about 50 $\mu$m and 100 $\mu$m wide. The emitters are arranged with their emitting-apertures aligned in the width direction of the emitters, which is in the length direction of the diode-laser bar. Accordingly, the emitters in a diode-laser bar may be spaced apart by only a few micrometers in the length direction of a bar.

When diode-laser bars are stacked to form a two-dimensional array of diode-lasers, spacing of corresponding diode-lasers in adjacent bars is determined by the thickness of the bar and any cooling device associated with the bar. This results in a vertical spacing of emitters which may be no less than about a millimeter. It would be useful to provide optical apparatus that could provide the effect of more closely vertically spaced emitters in a two dimensional array of diode-lasers.

SUMMARY OF THE INVENTION

The present invention is directed to a method for combining M laser-radiation beam groups with N laser radiation beam groups where M and N are integers greater than one. Each of the groups includes at least two beams, spaced apart and parallel to each other. The M beam groups are parallel to each other and spaced apart by a distance V, and the N beam groups are parallel to each other and spaced apart by a distance V. In one aspect the inventive method comprises providing a beam combiner including a plurality of reflective strips in a beam combiner plane. The reflective strips are spaced apart and parallel to each other, with transparent regions between adjacent ones of the reflective strips. The M beam groups are directed onto the beam combiner at a first non-normal incidence angle to the beam combiner plane such that the beam groups pass through the beam combiner plane without being intercepted by the reflective strips, and with one or more of the M beam groups passing through a transparent region. The N beam groups are directed onto the beam combiner at a second non-normal incidence angle to the beam combiner plane such that the beam groups are reflected by the reflective strips. The N beam groups are aligned with the beam combiner and the second non normal incidence angle is selected such that the N beam groups are reflected by the reflective strips in a direction parallel to the M transmitted beam groups. This provides M+N beam groups propagating parallel to each other and spaced apart by a distance less than V, and preferable equal to about V/2.

In another aspect of the invention, the M and N groups spaced apart by distance V may be parallel to each other and a reflector provided for directing the N beam groups onto the beam combiner. The parallel beam groups may be beam groups provided by a stack of M+N diode laser bars spaced apart by distance V. The reflective strips may be formed at an optically bonded interface of a triangular prism and a parallelepiped prism, with the bonded interface defining the beam combiner plane, and with a face of the parallelepiped prism parallel to the bonded interface providing the reflector. The reflective strips may also be formed on one end of one side of a parallel-sided transparent slab, with the side of the slab defining the beam combiner plane, and with the reflector being formed at the opposite end of the opposite side of the parallel-sided slab. These and other aspects and embodiments of the invention are discussed in the detailed description of the invention set forth below.

BRIEF DESCRIPTION OF THE DRAWINGS

The accompanying drawings, which are incorporated in and constitute a part of the specification, schematically illustrate a preferred embodiment of the present invention, and together with the general description given above and the detailed description of the preferred embodiment given below, serve to explain the principles of the present invention.

DETAILED DESCRIPTION OF THE INVENTION

Figure 1:
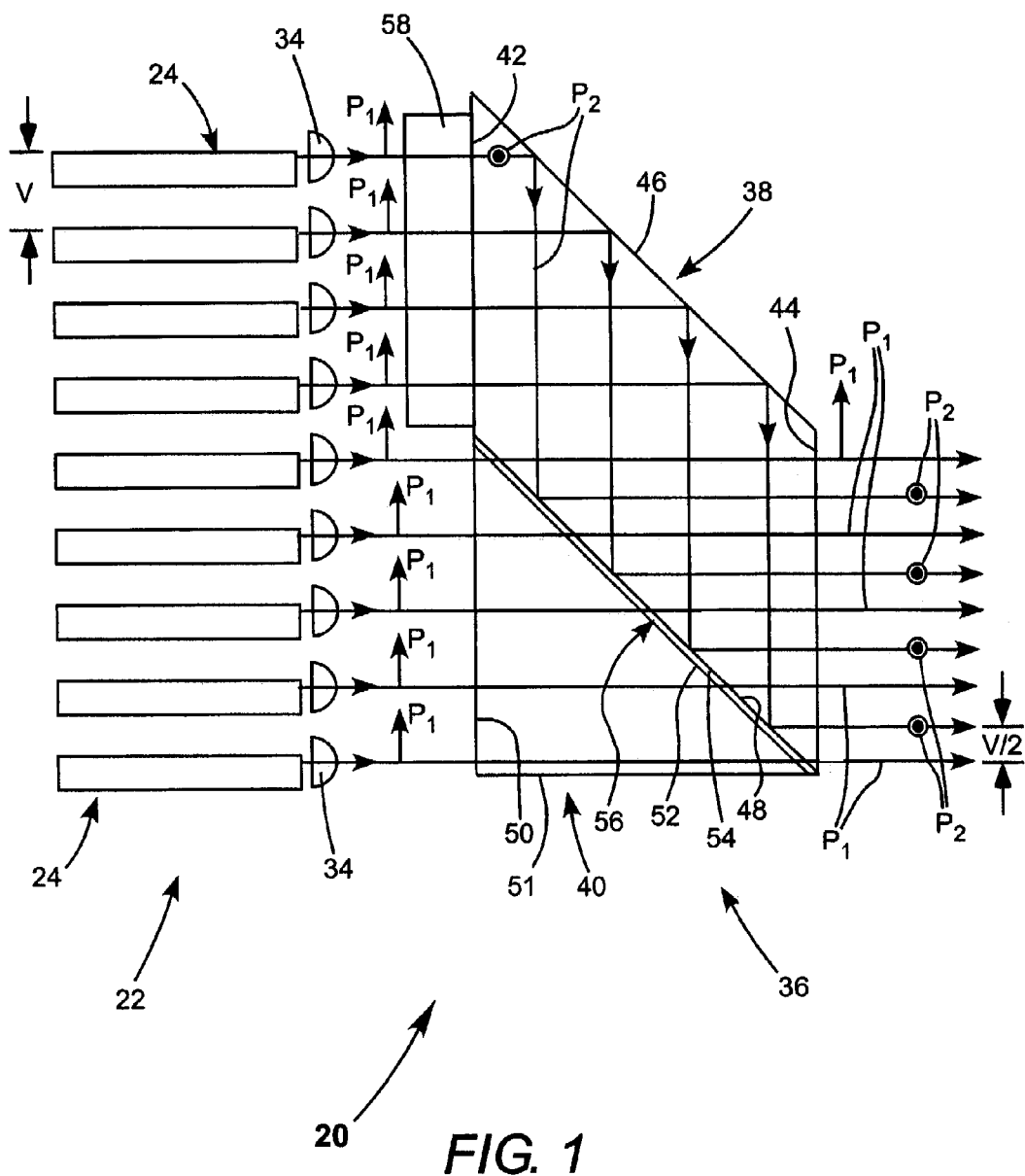
FIG. 1 is an elevation view schematically illustrating a first embodiment of apparatus in accordance with the present invention, including a vertical stack of diode-laser bars, and a polarization rotator and a two-element compound prism arranged to half the vertical spacing of output beams of the diode-laser bars.
Figure 2:
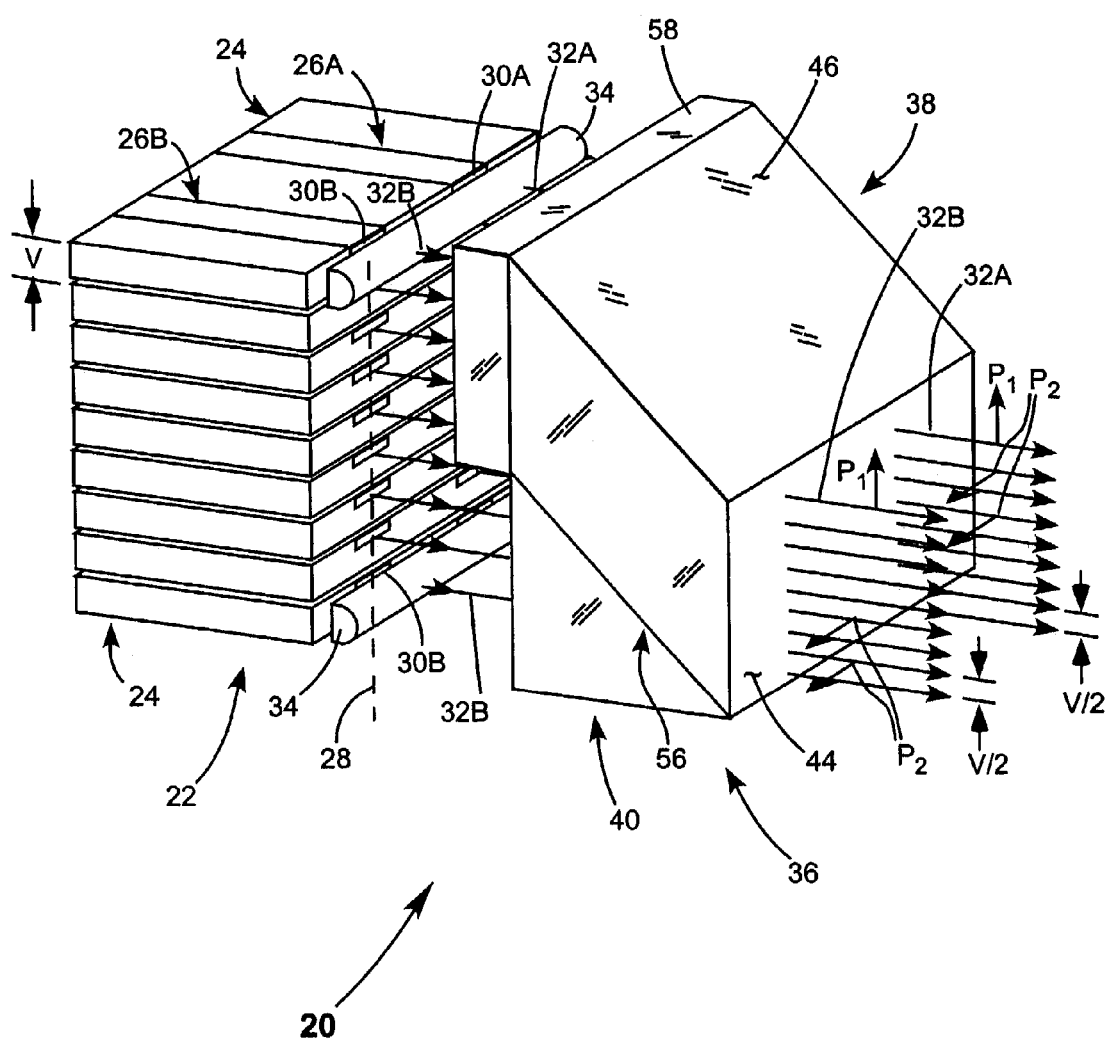
FIG. 2 is a three-dimensional view schematically illustrating one example of the apparatus of FIG. 1.

Referring now to the drawings wherein like features are designated by like reference numerals, FIG. 1 and FIG. 2 schematically illustrate a first embodiment 20 of apparatus in accordance with the present invention. Apparatus 20 includes a vertical stack 22 of diode-laser bars 24. Each diode-laser bar includes two diode-lasers (emitters) 26A and 26B having emitting apertures 30A and 30B respectively. Diode-laser bars are shown with only two emitters, here, for convenience of illustration. The present invention is equally applicable to diode-laser bars having more than two emitters as well as to a vertical stack of individual emitters. In FIG. 2, corresponding emitters in each diode-laser bar are depicted as being vertically aligned as indicated by dotted line 28. This should not be construed, however, as limiting the present invention.

In each diode-laser bar, emitters 26A and 26B emit beams 32A and 32B, respectively, from emitting apertures 30A and 30B respectively (see FIG. 2). Beams, here, are depicted by single lines, representing the propagation direction of the beams, for convenience of illustration. The diode-laser bars are arranged such that the beams propagate parallel to each other. Those familiar with the diode-laser art will recognize that a diode-laser emits a beam that diverges at a half angle of about 35° in a so-called fast-axis and at a half-angle of between about 5° and 15° in a so-called slow-axis direction. The fast-axis direction and slow-axis direction are respectively perpendicular and parallel to the length direction of the emitting aperture, i.e., respectively perpendicular and parallel to the length direction of the diode-laser bar. The divergence in the slow-axis direction is directly dependent, inter alia, on the width of the diode-laser. Each diode-laser bar 24 is provided with a cylindrical lens 34 arranged to collimate beams 32A and 32B in the fast-axis direction only. Only two lenses 34 are depicted in FIG. 2 for convenience of illustration.

Output beams from diode-lasers are plane-polarized. The beams may be plane-polarized with the electric vector in the fast-axis direction or the slow-axis direction, depending inter alia, on the method by which the diode-lasers are grown. In FIGS. 1 and 2 the beams are depicted with the electric vector parallel to the fast-axis direction as indicated by arrows $P_1$. Diode-laser bars having this polarization orientation are available from Coherent Inc. of Santa Clara, Calif.

Output beams 32A and 32B from diode-laser bar stack 22 have a vertical spacing V corresponding to the vertical spacing of diode-laser bars 24 in the stack. The output beams are directed toward a composite prism 36 having a parallelepiped prism component 38 and a triangular prism component 40. Triangular prism 40 has right-angle faces 50 and 51, and a hypotenuse face 52. Right-angle face 50 serves as an entrance face. Hypotenuse face 52 is depicted in FIG. 1 as being at 45° to right-angle faces 50 and 51 but this should not to be construed as limiting the present invention. Parallelepiped prism 38 has opposite parallel faces 42 and 44. These faces are transmissive and serve as respectively entrance and exit faces. Parallelepiped prism 38 also has opposite parallel faces 46 and 48. These faces are inclined at 45° and 135° to faces 42 and 44. Here again, these angles should not be construed as limiting the present invention. Face 46 is internally reflective for light incident thereon at 45°.

Face 48 of parallelepiped prism 38 and hypotenuse face 52 of triangular prism 40 are optically bonded together with a highly polarization sensitive (when optically immersed in a medium having the refractive index of the prisms) reflecting coating 54 therebetween. Coating 54 may be deposited on either surface 52 or surface 48. Bonding may be effected using an optical cement or even by optically contacting the surfaces. Bonding these surfaces with the coating provides, in effect, a single internal surface 56 that is highly transmissive, for example greater than 99% transmissive, for radiation incident at 45° plane-polarized in orientation $P_1$. Surface 56 is highly reflective, for example greater than 99% reflective, for radiation incident at 45° plane-polarized in an orientation $P_2$ at 90° to orientation $P_1$.

Five pairs 32A and 32B of beams polarized in orientation $P_1$ enter compound prism 36 through face 50 of triangular prism component 40 of the compound prism, are transmitted through polarization selective reflecting surface 58, and exit the compound prism via face 44 of parallelepiped prism component 38. Four pairs 32A and 32B of beams polarized in orientation $P_1$ are transmitted through a half-wave plate 58 (polarization rotator), which rotates the plane of polarization of the beams by 90° into orientation $P_2$. Polarization rotator 58 is depicted here as being bonded to compound prism 36. This should not be (considered as limiting the present invention, as the polarization may be free standing.

The four beam-pairs polarized in orientation $P_2$ are reflected from face 46 of parallelepiped prism 38 and then reflected from polarization selective reflecting surface 56 of compound prism 36. After reflection from surface 56 the $P_2$-polarized beams exit compound prism 36 via face 44 of parallelepiped prism component 38. The dimensions of compound prism 36 are selected, cooperative with the angles at which component prism faces are inclined, such that each $P_2$-polarized beam leaves the compound prism parallel to and midway between two $P_1$-polarized beams. This reduces the vertical spacing between pairs of beams leaving compound prism 36 to a value V/2, i.e., one-half the spacing of corresponding beam-pairs leaving diode-laser bars 24 in stack 22 thereof. In this example the V/2 spacing of beam pairs is effected by making the vertical spacing between faces 46 and 48 (the height of face 42) of parallelepiped prism component 38 equal to nV plus V/2, where n is equal to the number of bars in the upper group.

Figure 3:
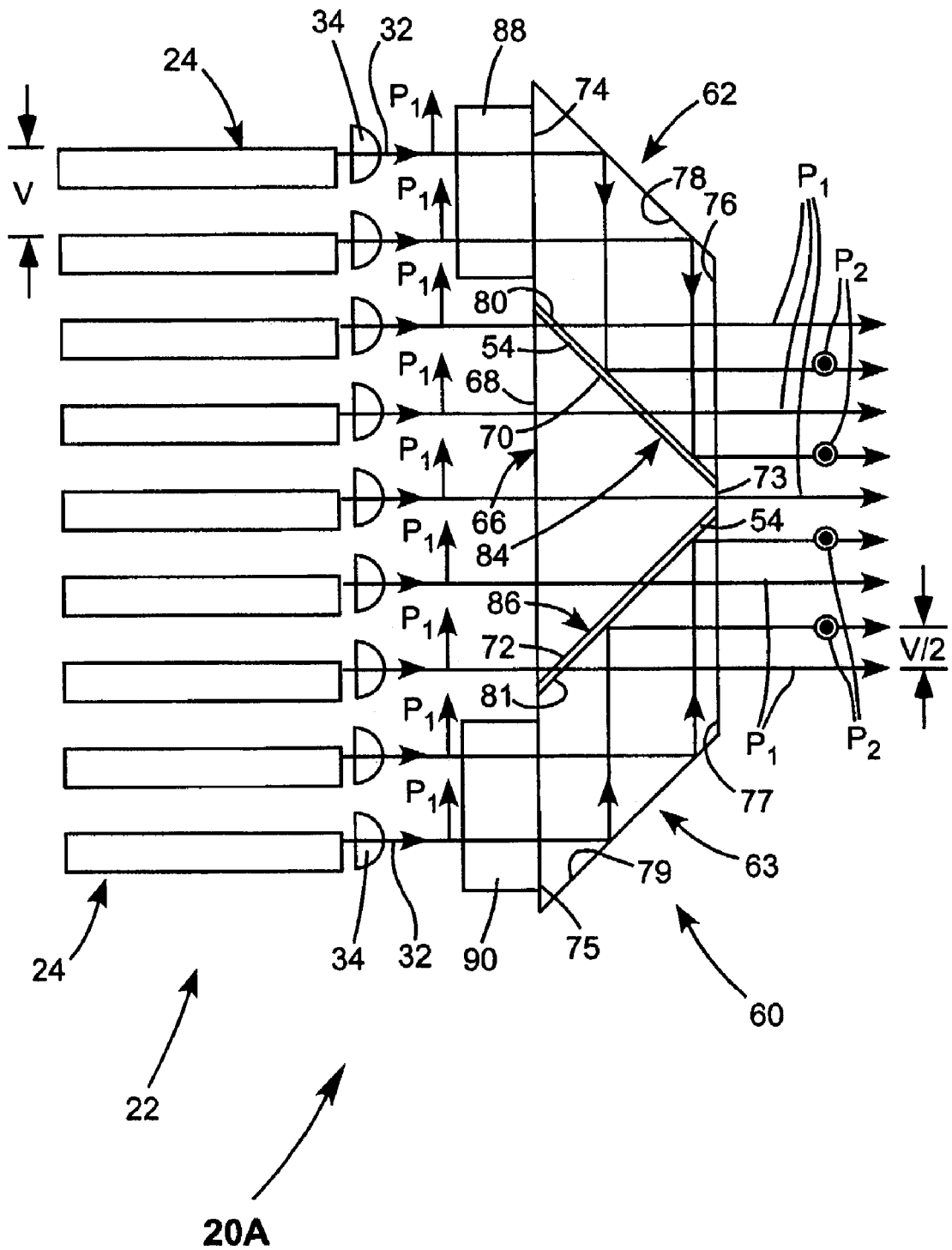
FIG. 3 is an elevation view schematically illustrating a second embodiment of apparatus in accordance with the present invention including a vertical stack of diode-laser bars, two polarization rotators and a three-element compound prism arranged to half the vertical spacing of output beams of the diode-laser bars.

Referring now to FIG. 3, a second embodiment 20A of apparatus in accordance with the present invention includes a stack 22 of diode-laser bars 24 configured as discussed above with respect to FIGS. 1 and 2. Apparatus 20A includes a compound prism 60 including two parallelepiped prism components 62 and 63, and a truncated, isosceles, triangular prism component 66.

Triangular prism 66 has a base face 68 and isosceles faces 70 and 72. Base face 68 serves as an entrance face. There is a truncation face 73 between isosceles faces and 70 and 72. Isosceles faces 70 and 72 are depicted in FIG. 3 as being at 90° to each other but this should not be construed as limiting the present invention. Truncation face 73 is depicted in FIG. 3 as being parallel to base face 69 but this should also not be construed as limiting the present invention.

Parallelepiped prism 62 has opposite parallel faces 74 and 76, and parallelepiped prism 63 has corresponding opposite parallel faces 75 and 77. These faces are transmissive and serve, in each case, as respectively entrance and exit faces. Parallelepiped prism 62 also has opposite parallel faces 78 and 80, and parallelepiped prism 63 has corresponding opposite parallel faces 79 and 81. Faces 78 and 80 of parallelepiped prism 62 are inclined at 45° and 135° to faces 74 and 76. Faces 79 and 81 of parallelepiped prism 63 are inclined at 45° and 135° to faces 75 and 77. Here again, these angles should not be construed as limiting the present invention. Face 78 of parallelepiped prism 62 and face 79 of parallelepiped prism 63 are each internally reflective for light incident thereon at 45°.

Face 80 of parallelepiped prism 62 and isosceles face 70 of triangular prism 66 are optically bonded together, and face 81 of parallelepiped prism 63 and isosceles face 72 of triangular prism 66 are also optically bonded together. These prism faces are bonded together, in each case, with a highly polarization sensitive coating 54 therebetween, as discussed above with respect to compound prism 36 of FIG. 1. Bonding these surfaces with the coating provides in effect two single internal surfaces 84 and 86 that are each highly transmissive for radiation incident thereon at 45°, plane-polarized in orientation $P_1$, and highly reflective, for radiation incident thereon at 45°, plane-polarized in an orientation $P_2$.

Five beam pairs 32 (actually beam pairs 32A and 32B as seen in FIG. 2) polarized in orientation $P_1$ enter compound prism 60 through base face 68 of triangular prism component 66 of the compound prism. Two of these five pairs of beams are transmitted through polarization selective reflecting surface 84, and exit the compound prism via face 76 of parallelepiped prism 62 of the compound prism. One of these five pairs of beams exits the compound prism via truncation face 73 of triangular prism 66 of the compound prism. Another two of these five pairs of beams are transmitted through polarization selective reflecting surface 86, and exit the compound prism via face 77 of parallelepiped prism 63 of the compound prism.

Two pairs 32A and 32B of beams polarized in orientation $P_1$ are transmitted through a half-wave plate 88 (polarization rotator), which rotates the plane of polarization of the beams by 90° into orientation $P_2$. The two beam-pairs polarized in orientation $P_2$ are reflected from face 78 of parallelepiped prism 62 and then reflected from polarization selective reflecting surface 84 of compound prism 60. After reflection from surface 84 the $P_2$-polarized beams exit compound prism 60 via face 76 of parallelepiped prism 62 of the compound prism. Another two pairs 32A and 32B of beams polarized in orientation $P_1$ are transmitted through a half-wave plate 90, which rotates the plane of polarization of the beams by 90° into orientation $P_2$. These two pairs of beams undergo reflections at face 79 of parallelepiped prism 63 and surface 86 of the compound prism, exiting the compound prism via face 77 of parallelepiped prism 63.

The dimensions of compound prism 60 are selected, cooperative with the angles at which component prism faces are inclined, such that each $P_2$-polarized beam leaves the compound prism parallel to and midway between two $P_1$-polarized beams. This reduces the vertical spacing between pairs of beams leaving compound prism 36 to a value V/2, i.e., one-half the spacing of corresponding beam-pairs leaving diode-laser bars 24 in stack 22 thereof. This is the same result as is achieved by above described apparatus 20 of FIG. 1. An advantage of apparatus 20A compared with apparatus 20 is that beams traverse a shorter path in compound prism 60 than in compound prism 36. This can be of advantage in limiting beam width due to divergence in the slow-axis. A disadvantage of apparatus 20A compared with apparatus 20 is that compound prism 60 is more complex than compound prism 36 and, accordingly, may be more expensive to manufacture.

Figure 4:
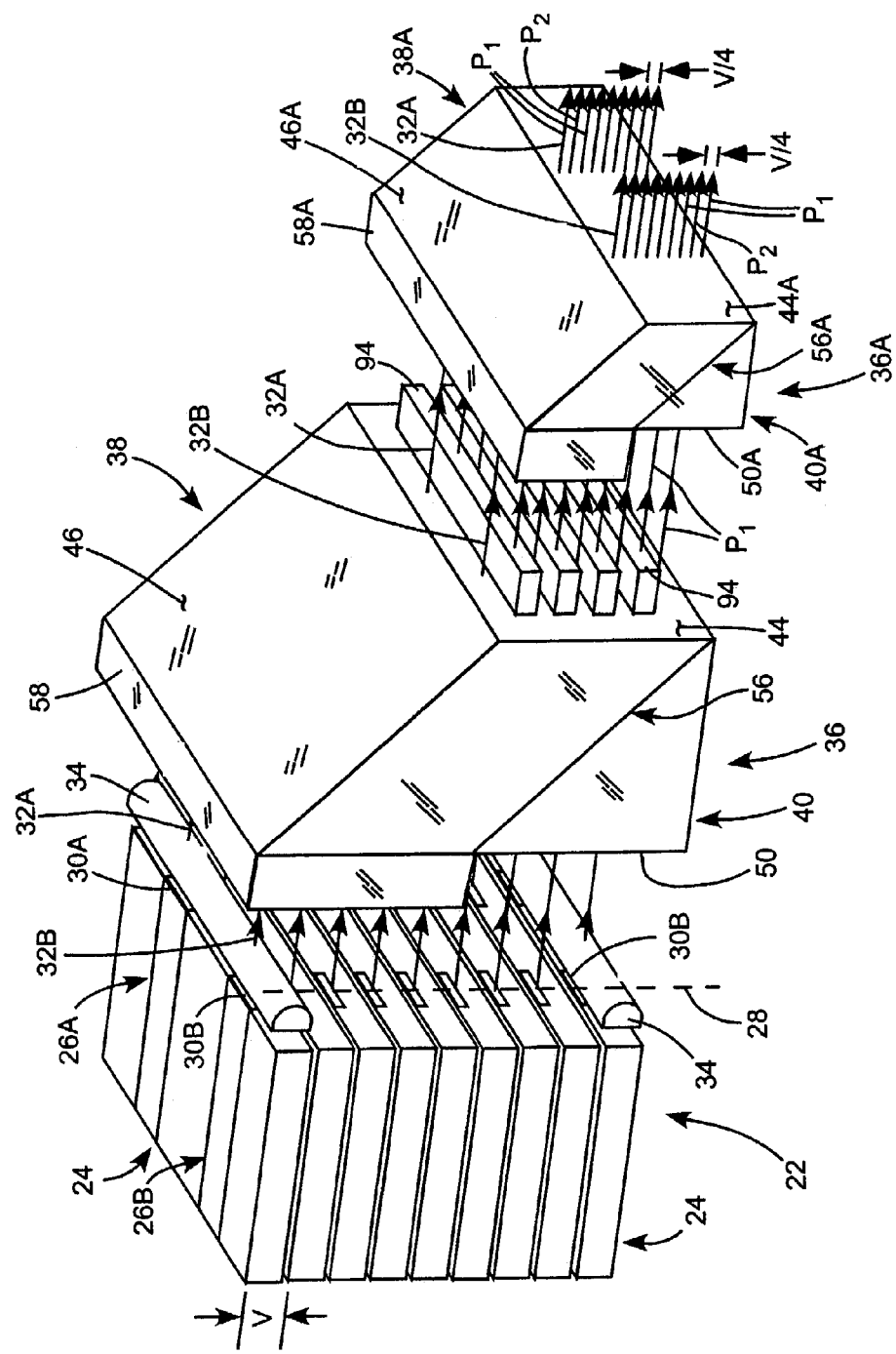
FIG. 4 is a three dimensional view schematically illustrating a third embodiment of apparatus in accordance with the present invention including a vertical stack of diode-laser bars, a plurality of polarization rotators and first and second two-element compound prisms arranged to quarter the vertical spacing of output beams of the diode-laser bars.

Referring now to FIG. 4, a third embodiment 21 of apparatus in accordance with the present invention is arranged to reduce the vertical spacing of beams emitted by a vertical stack of diode-laser bars by a factor of four.

Apparatus 21 includes a stack 22 of diode-laser bars 24, cylindrical lenses 134, a half-wave plate polarization rotator 58 and a compound prism 36 cooperatively arranged to provide nine pairs 32A and 32B of parallel beams having a vertical spacing equal to one-half of the spacing of the diode-laser bars in stack 22 thereof, as described above with reference to apparatus 20 of FIGS. 1 and 2.

Four half-wave polarization rotators 94, here, in an elongated rectangular or strip form for convenience of manufacture, are arranged spaced apart and parallel to each other, adjacent to or bonded to face 44 of parallelepiped prism 38 of compound prism 36. Polarization rotators 94 are arranged to intercept only those pairs of beams polarized in orientation $P_2$ and rotate the polarization of those pairs of beams to orientation $P_1$. Beam-pairs already polarized in orientation $P_1$ pass between polarization rotators 94 with polarization orientation unchanged. As a result nine parallel beam-pairs are produced, all polarized in orientation $P_1$, with a vertical spacing therebetween of V/2, half the vertical spacing V of diode-laser bars 24 in stack 22.

The nine parallel beam-pairs are directed toward another compound prism 36A, including a parallelepiped prism component 38A and a triangular prism component 40A. Compound prism 36A is configured similarly to above described compound prism 36, with an exception that dimensions of certain features compound prism 36A are only one-half the dimensions of corresponding features of compound prism 36. Similar features of the two compound prisms are designated by like reference numerals with the features of compound prism 36A identified by a suffix A. By way of example, exit face 44A of compound prism 36A corresponds to exit face 44 of compound prism 36, reflective face 46A of compound prism 36A corresponds to reflective face 46 of compound prism 36, and so on. Prism components 38A and 40A are bonded together with an optical coating to provide an internal, polarization selective reflective surface 56A.

Five of the nine parallel-beam-pairs enter compound prism 36A through face 50A thereof. These five beams are transmitted through polarization selective reflective surface 56A and exit the compound prism via face 44A thereof. The other four of the parallel beam-pairs are transmitted by a polarization rotator 58A, which rotates the polarization plane of the beams by 90° into orientation $P_2$. The $P_2$-polarized beam-pairs undergo successive reflections from face 46A and polarization selective reflective surface 56A, and exit the compound prism via face 44A thereof. Dimensions and angles of the compound prism are selected such that the $P_2$-polarized beam-pairs exit face 44A midway between and parallel to the $P_1$-polarized beam-pairs. This provides nine pairs 32A and 32B of parallel beams having a vertical spacing V/4, i.e., one-quarter of the vertical spacing V of the diode-laser bars in stack 22 thereof.

Figure 5:
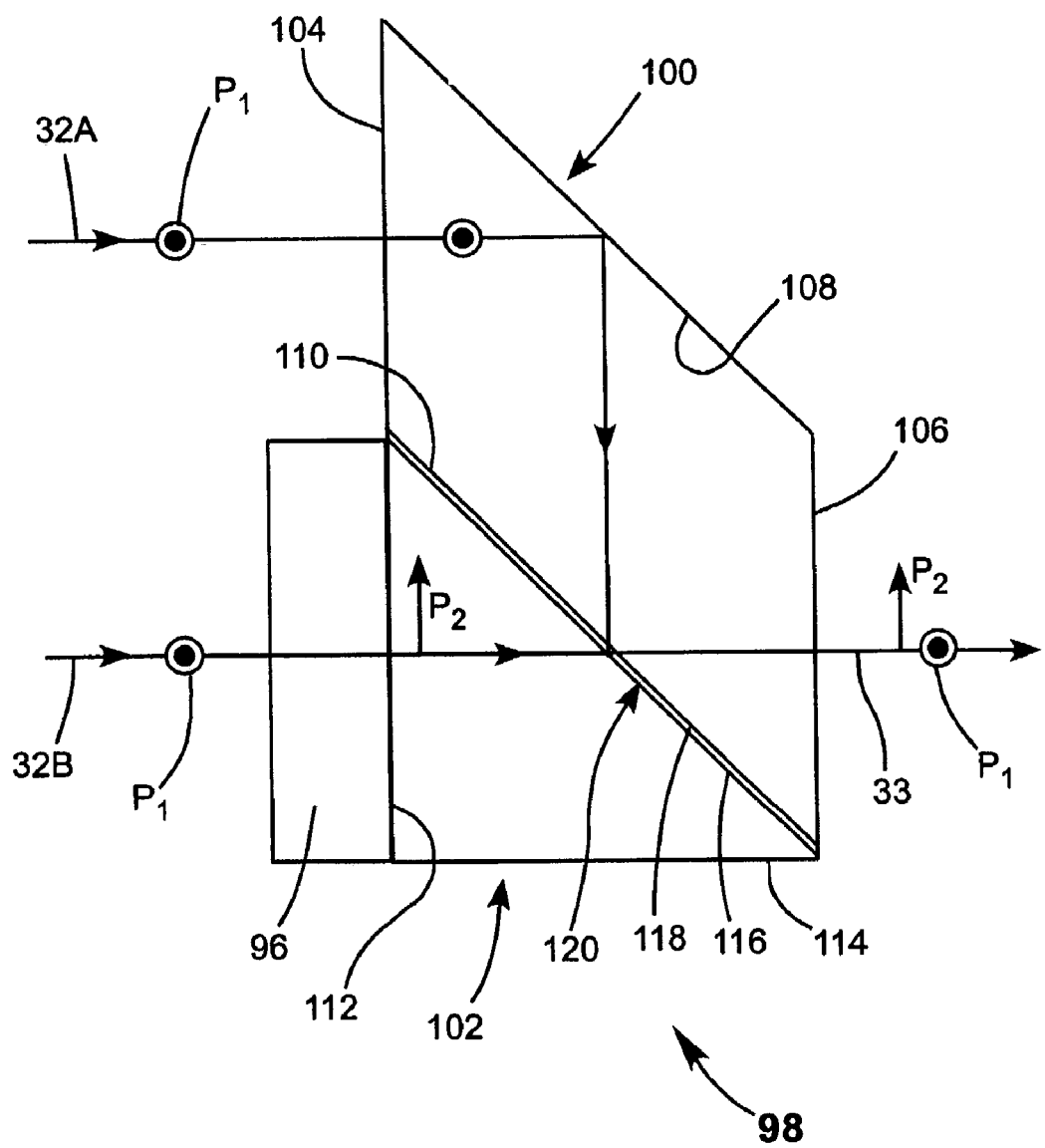
FIG. 5 is a plan view schematically illustrating a compound prism arranged to laterally overlap two horizontally spaced parallel beams from a diode-laser bar into a single beam.

In embodiments discussed above, the vertical spacing of output of beams from a vertical stack of diode-laser bars is reduced for increasing the intensity of beams as a group. Beam intensity or brightness may also be increased by overlapping horizontally spaced ones of the beams emitted by the diode-laser bar stack as depicted in FIG. 5. Here a polarization rotator 96 and a compound prism 98 are arranged to effect such a lateral overlap of beams 32A and 32B having polarization orientation $P_1$.

Compound prism 98 has a parallelepiped prism component 100 and a triangular prism component 102. Triangular prism 102 has right-angle faces 112 and 114, and a hypotenuse face 116. Hypotenuse face 116 is depicted in FIG. 1 as being at 45° to right-angle faces 112 and 114 but this should not be construed as limiting the present invention. Parallelepiped prism 100 has opposite parallel faces 104 and 106. These faces are transmissive and serve as respectively entrance and exit faces of the compound prism. Parallelepiped prism 100 also has opposite parallel faces 108 and 110. These faces are inclined at 45° and 135° to faces 104 and 106. Here again, these angles should not be construed as limiting the present invention. Face 108 is internally reflective for light incident thereon at 45°.

Face 110 of parallelepiped prism 100 and hypotenuse face 116 of triangular prism 102 are optically bonded together with a highly polarization sensitive reflecting coating 118 therebetween. Coating 118 may be deposited on either face 110 or face 116. Bonding may be effected, for example, by using an optical cement or by optically contacting the surfaces. Bonding these surfaces with the coating provides, in effect, a single internal surface 120 that is highly transmissive for radiation incident at 45° plane-polarized in orientation $P_2$. Surface 120 is highly reflective for radiation incident at 45° plane-polarized in orientation $P_1$ at 90° to orientation $P_2$.

Figure 6:
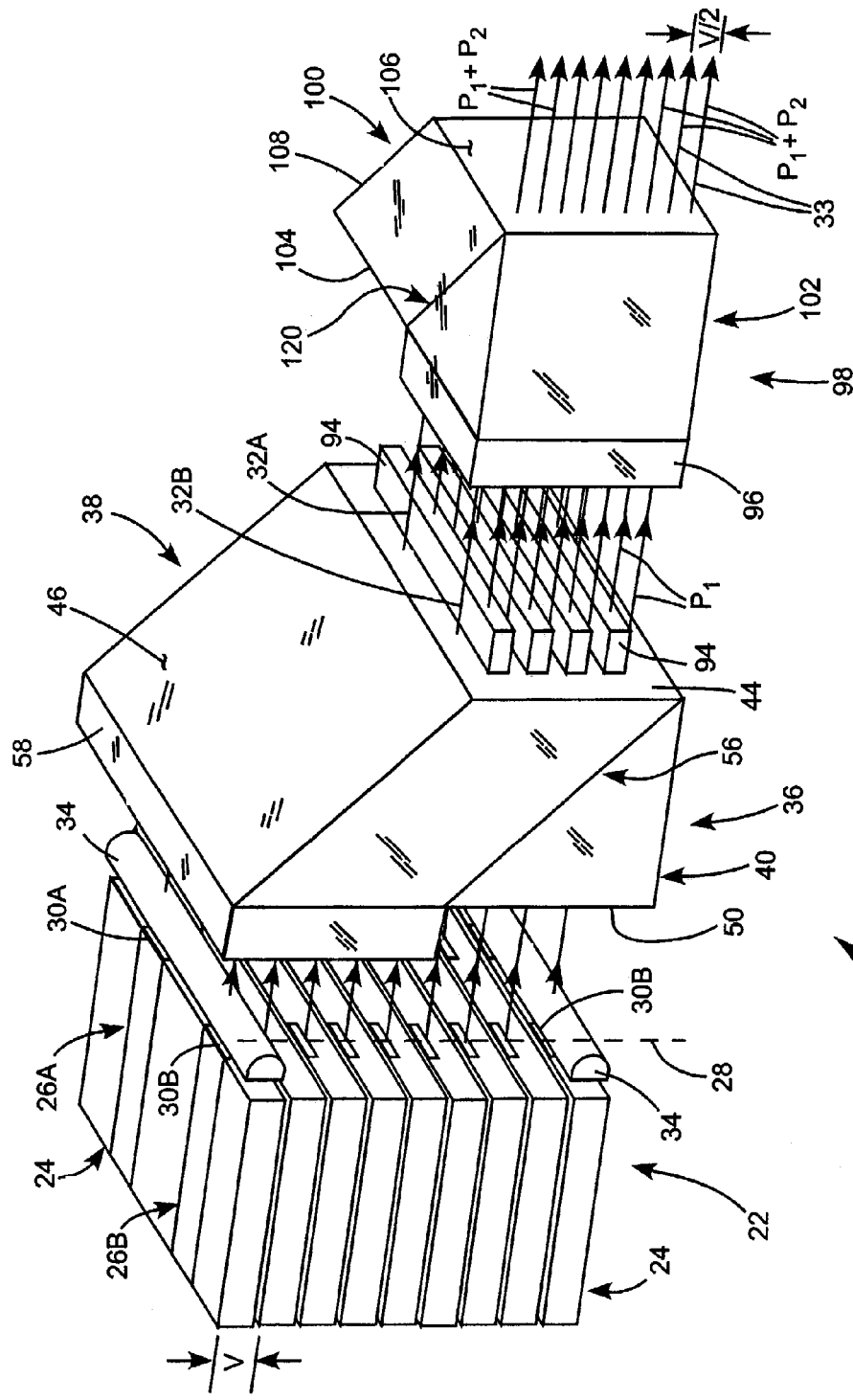
FIG. 6 is a three-dimensional view schematically illustrating a fourth embodiment of apparatus in accordance with the present invention including the apparatus of FIG. 1 arranged to half the vertical spacing of output beams of the diode-laser bars, and a plurality of polarization rotators and the compound prism of FIG. 5 arranged to overlap horizontally spaced output beams having the halved vertical spacing.

Referring now to FIG. 6, with continuing reference to FIG. 5, a fourth embodiment 23 of apparatus in accordance with the present invention includes a polarization rotator 58 and a compound prism 36 arranged to half the vertical spacing of pairs 32A and 32B of beams emitted by diode-laser bars 24 in a stack 22 thereof as discussed above with reference to FIGS. 1 and 2. Beam-pairs having the reduced vertical spacing exit face 44 of compound prism 36.

Four half-wave polarization rotators 94 are arranged spaced apart and parallel to each other, adjacent to or bonded to face 44 of parallelepiped prism 38 of compound prism 36. Polarization rotators 94 are configured and arranged as discussed above with reference to apparatus 21 of FIG. 4 to provide nine parallel beam-pairs, all polarized in orientation $P_1$, with a vertical spacing therebetween of V/2, half the vertical spacing V of diode-laser bars 24 in stack 22 thereof.

Each beam 32B is transmitted by polarization rotator 96, which rotates the polarization of the beam to orientation $P_2$. The $P_2$-polarized beams are transmitted through polarization selective reflecting surface 120, and exit compound prism 98 through face 106. Each beam 32A enters compound prism 98 through face 104, is sequentially reflected from face 108 and polarization selective reflecting surface 120 and exits compound prism 98 through face 106. Dimensions and angles of the compound prism are selected, here, such that each beam 32A exits the compound prism along the same path as, i.e., overlapped with, a corresponding beam 32B. This provides a beam 33 having both $P_1$ and $P_2$-polarized components. Accordingly apparatus 21 provides nine parallel vertically spaced beams 33, each having both $P_1$ and $P_2$-polarized components.

It should be noted here that beam dimensions and angles of compound prism 98 may be selected cooperative with horizontal spacing H such that beams 32A and 32B do not overlap on exiting the compound prism, but merely have the horizontal spacing therebetween reduced. Overlapping beams, of course, have horizontal spacing thereof reduced to zero. It should also be noted that diode-laser bars may include more emitters and thereby emit more beams than diode-laser bars 24. Diode-laser bars may include as many as fifty emitters. Those skilled in that art will recognize that a compound prism such as prism 98 could overlap four horizontally spaced beams to provide two compound beams, six horizontally spaced beams to provide three compound beams, and so on. An extensive description of beam overlapping using compound prisms such as prism 98 is provided in copending application Ser. No. 10/266,066 filed Oct. 7, 2002, the complete disclosure of which is hereby incorporated by reference.

Figure 7:
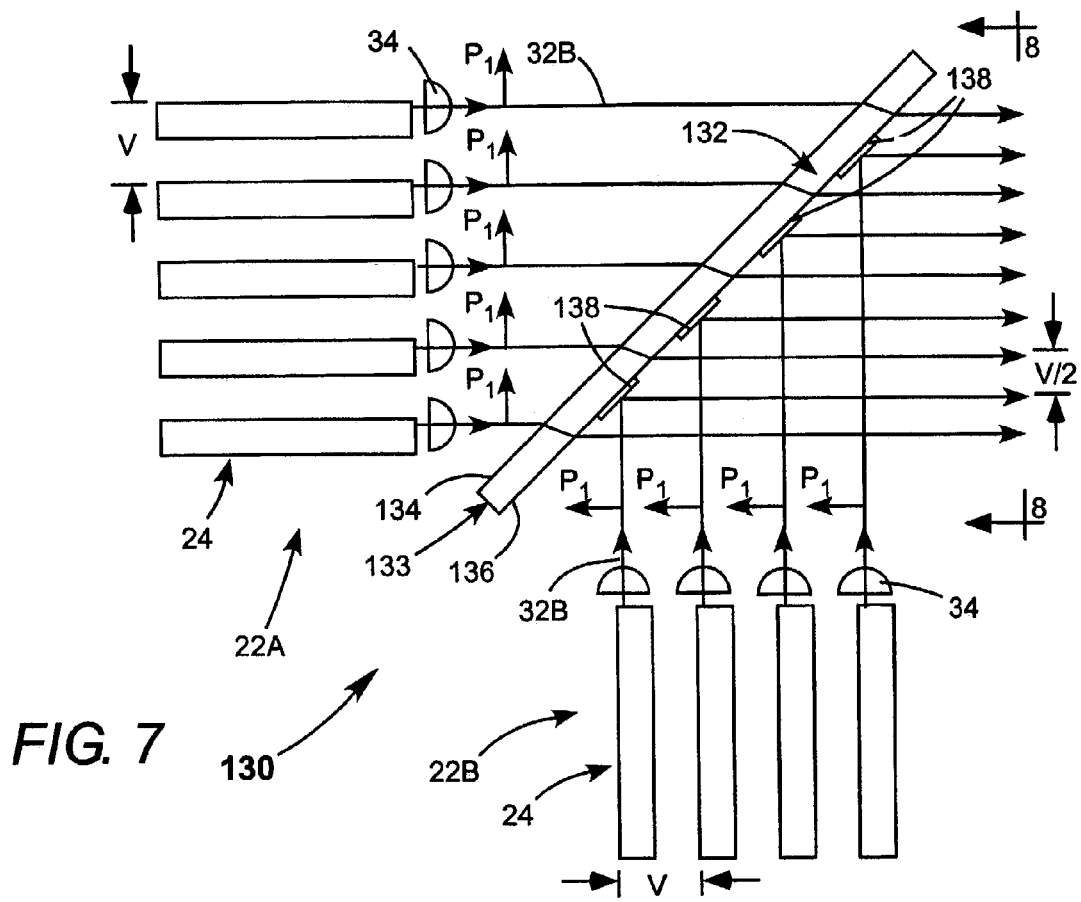
FIG. 7 is a side elevation view schematically illustrating a fifth embodiment of apparatus in accordance with the present invention including two stacks of diode-laser bars having the same spacing therebetween, and a beam combiner including spaced apart reflective strips for combining output beams from the diode-laser bars into a parallel set of beams having a vertical spacing therebetween equal to one-half the spacing of the diode-laser bars.
Figure 8:
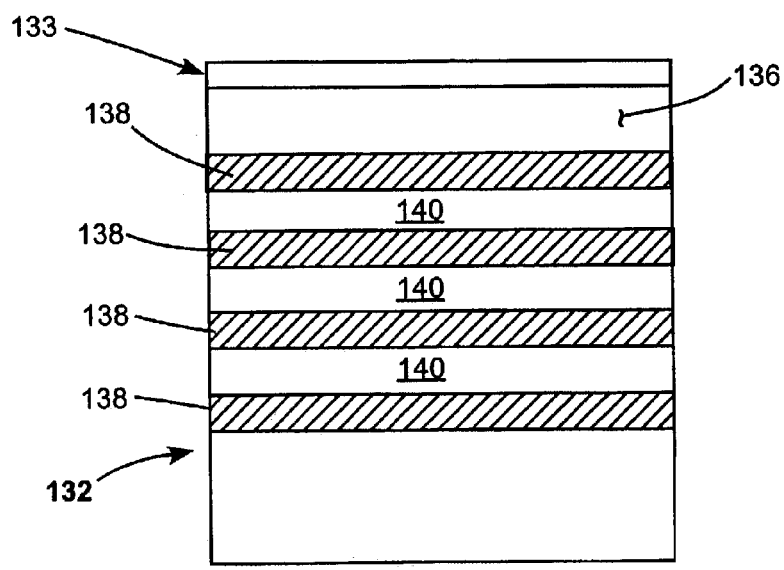
FIG. 8 is a front elevation view, seen generally in the direction 8—8 of FIG. 7, schematically illustrating details of the beam combiner of FIG. 7.

Referring now to FIG. 7 and FIG. 8, a fifth embodiment 130 of apparatus in accordance with the present invention includes two stacks 22A and 22B of respectively five and four, diode-laser bars 24. Emitters (not shown) in each stack, here, emit parallel pairs of beams polarized in orientation $P_1$. Only one beam 32B from each bar is visible in FIG. 7. The spacing of diode-laser bars 24 in each stack is the same, here equal to V. Stack 22B emits beams in a direction at 90° to the direction of beams emitted by stack 22A. Beams from each stack are collimated in the fast-axis direction by cylindrical microlenses 34.

Beams emitted by each stack are directed toward a beam combiner 132 on a substrate 133 having opposite surfaces 134 and 136. Beams from each of stacks 22A and 22B are incident on beam combiner 132 at 45° to the emission direction of the beams. Each of surfaces 134 and 136 preferably includes an antireflection coating (not shown) arranged to provide minimum reflection at the wavelength of the diode-laser beams in the polarization-orientation of the beams, here orientation $P_1$. Deposited on surface 136 and forming beam combiner 132 are four parallel, elongated reflective strips 138 separated by spaces 140 (see FIG. 8). Surface 136 here, defines a beam combiner plane. Strips 138 preferably having greater than 99% reflection for the wavelength of the diode-laser beams in the polarization-orientation of the beams. Reflective strips 138 are preferably sufficiently wide to intercept (at 45° incidence) the full height of a collimated beam from a diode-laser bar 24, and preferably spaced apart sufficient that such a beam can pass (again at 45° incidence) unvignetted through a space 140.

Beam combiner 132 is arranged with respect to diode-laser bar stack 22A such that, of the five beam-pairs emitted by the stack, outermost ones thereof are transmitted through the beam combiner, with one passing under and the other over reflective strips 138. The remaining three beam-pairs are transmitted through the beam combiner via a corresponding space 140 between the reflective strips. Beam combiner 132 is arranged with respect to diode-laser bar stack 22B such that the four beam-pairs emitted by the stack are intercepted by reflective strips 138 and reflected by the reflective strips parallel to and midway between beams transmitted through the strips. This provides vertically aligned, parallel beams having a vertical spacing V/2 (half the diode-laser bar spacing V) with all beams having the same polarization orientation.

It should be noted here that the selection of a 45° incidence angle for beam combiner 132 should not be construed as limiting the invention. Other incidence angles may be selected without departing from the spirit and scope of the present invention. Brewster angle incidence may be found convenient for beams polarized in orientation $P_1$ (in the plane of incidence). This minimizes reflection from the surfaces without the use of an antireflection coating. Incidence angles on front and rear surfaces may be different if surfaces 134 and 136 are inclined with respect to each other.

Figure 7A:
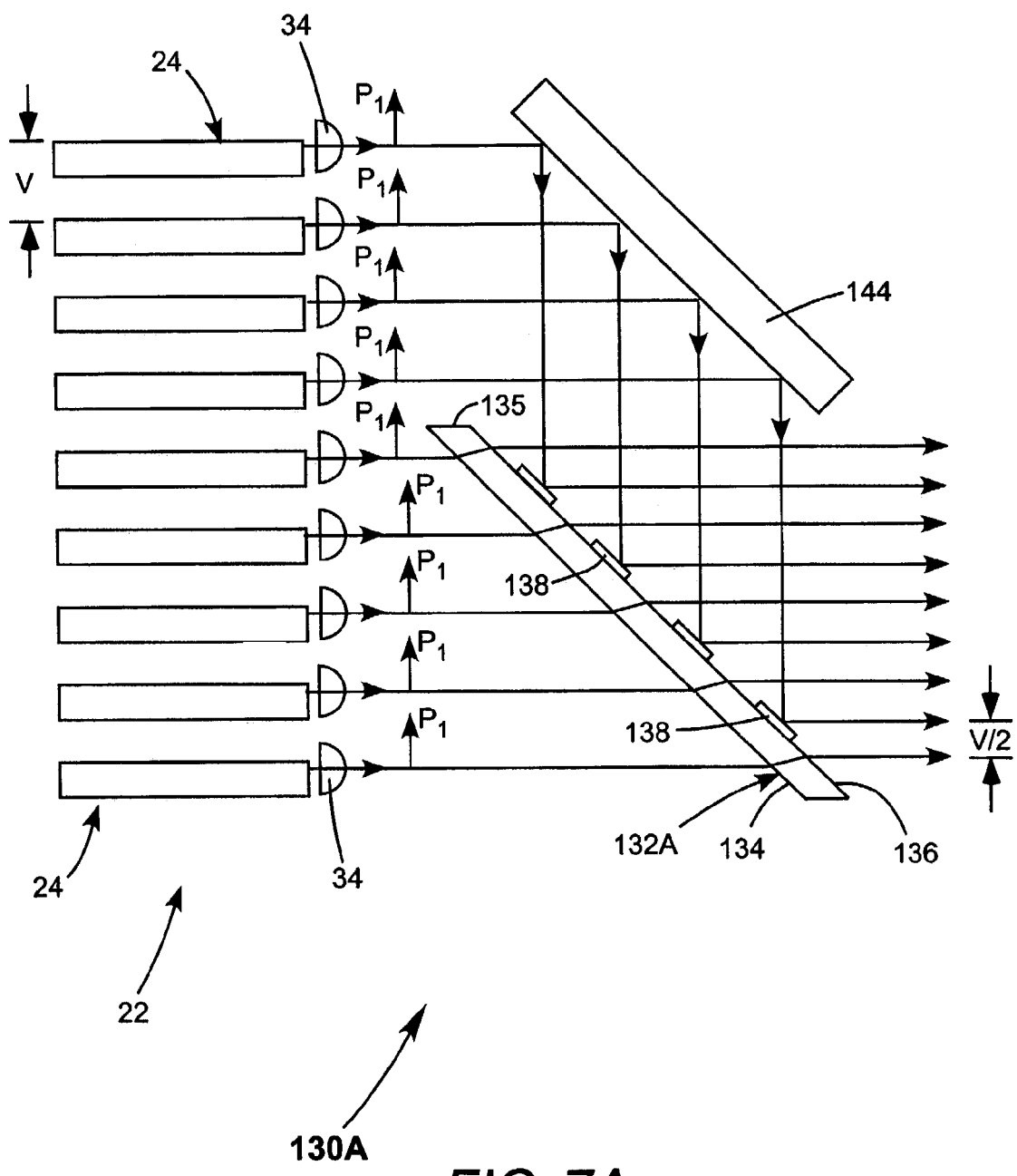
FIG. 7A is a side elevation view schematically illustrating apparatus in accordance with the present invention including the beam combiner of FIG. 7 with only one stack of diode-laser bars and a mirror cooperative with the beam combiner for combining output beams from the diode-laser bars into a parallel set of beams having a vertical spacing therebetween equal to one-half the spacing of the diode-laser bars.

FIG. 7A schematically illustrates a variation 130A of apparatus 30. Here, the apparatus includes only one stack 22 of diode-laser bars 24. The apparatus includes a beam combiner 132A similar to beam combiner 132 but wherein at least one edge 135 thereof is beveled to avoid vignetting output beams from the diode-laser bars. Beams from the diode laser bars to be reflected from reflective strips 138 of the beam combiner are reflected by a mirror 144 onto the beam combiner.

Figure 7B:
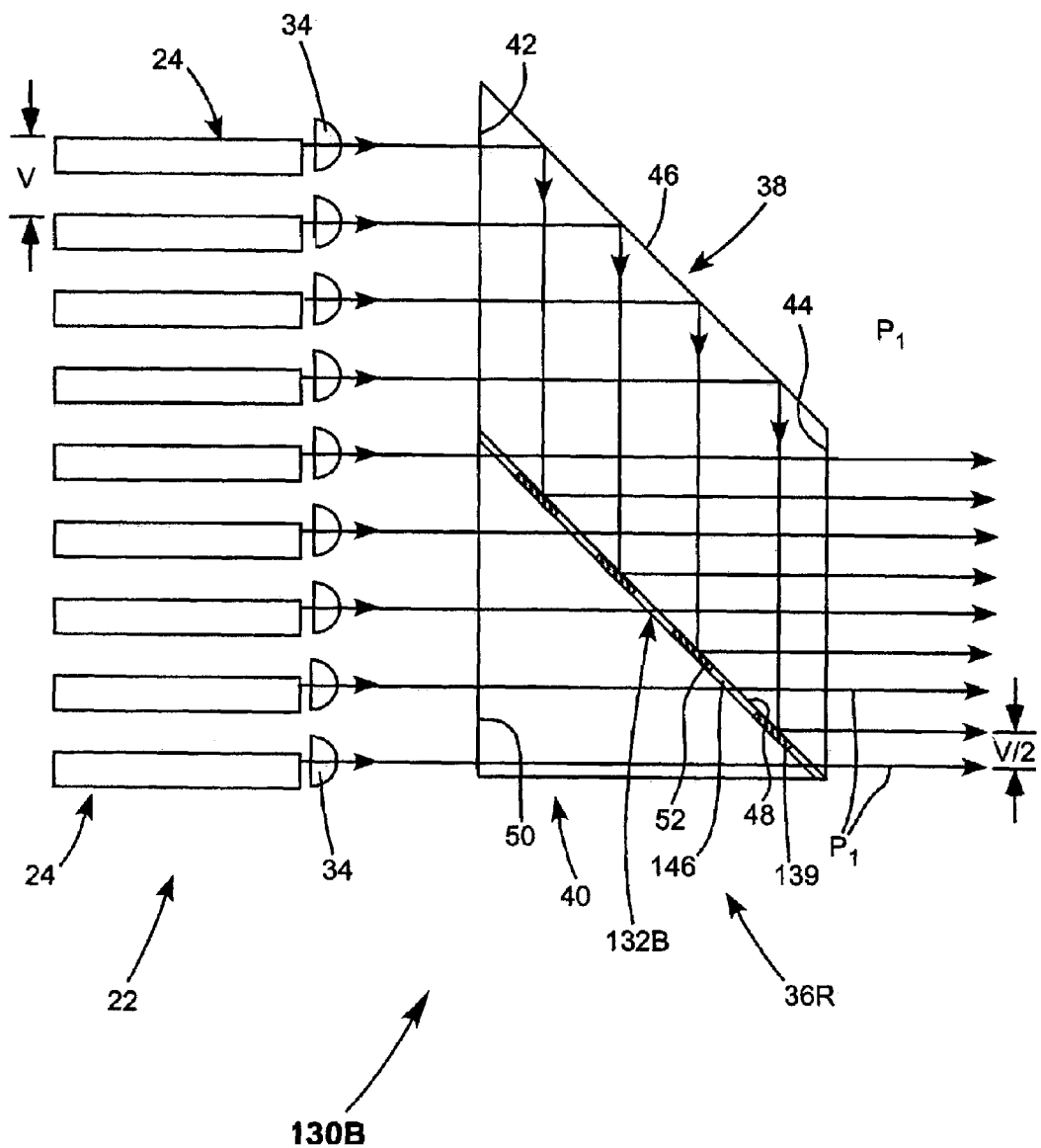
FIG. 7B is a side elevation view schematically illustrating apparatus in accordance with the present invention similar to the apparatus of FIG. 7A but wherein the beam combiner including reflective strips is incorporated in a compound prism.

FIG. 7B schematically illustrates a variation 130B of apparatus 130A. Here a beam combiner 132B is formed at a bonded interface between a parallelpiped prism 38 and a triangular prism 40 forming a compound prism 36R similar to compound prism 36 of apparatus 20 except for the bonded interface arrangement. In compound prism 37R reflective strips 139 (corresponding reflective strips 138 of apparatus 130A) are deposited on either face 52 of triangular prism 40, or on face 48 of parallelepiped prism 38, before the faces are bonded together by a transparent adhesive layer 146. Beam combiner 132B essentially comprises the reflective strips and the transparent adhesive filling spaces 40 therebetween. The beam combiner plane is defined by the interface. Face 46 of parallelepiped prism directs beams onto the reflective strips by total internal reflection.

Whether the radiation emitted by the diode-laser bars is polarized in orientation $P_1$ or in orientation $P_2$, it is advantageous to make strips 139 highly reflective for both orientations. By way of example an "enhanced metal" reflective coating including twenty-two layers alternating $Al_2O_3$ and ZnSe on a gold layer, with layers optimized in thickness for 45° incidence in the prism material, will provide about 99.9% reflection for $P_1$-polarized radiation and 99.99% or greater for $P_2$-polarized radiation with prism material (and adhesive) having a refractive index of about 1.52. Such a coating minimizes potential losses due to possible polarization impurity in diode-laser output beams, either inherent, or induced by possible stress birefringence effects in the compound prism.

Figure 7C:
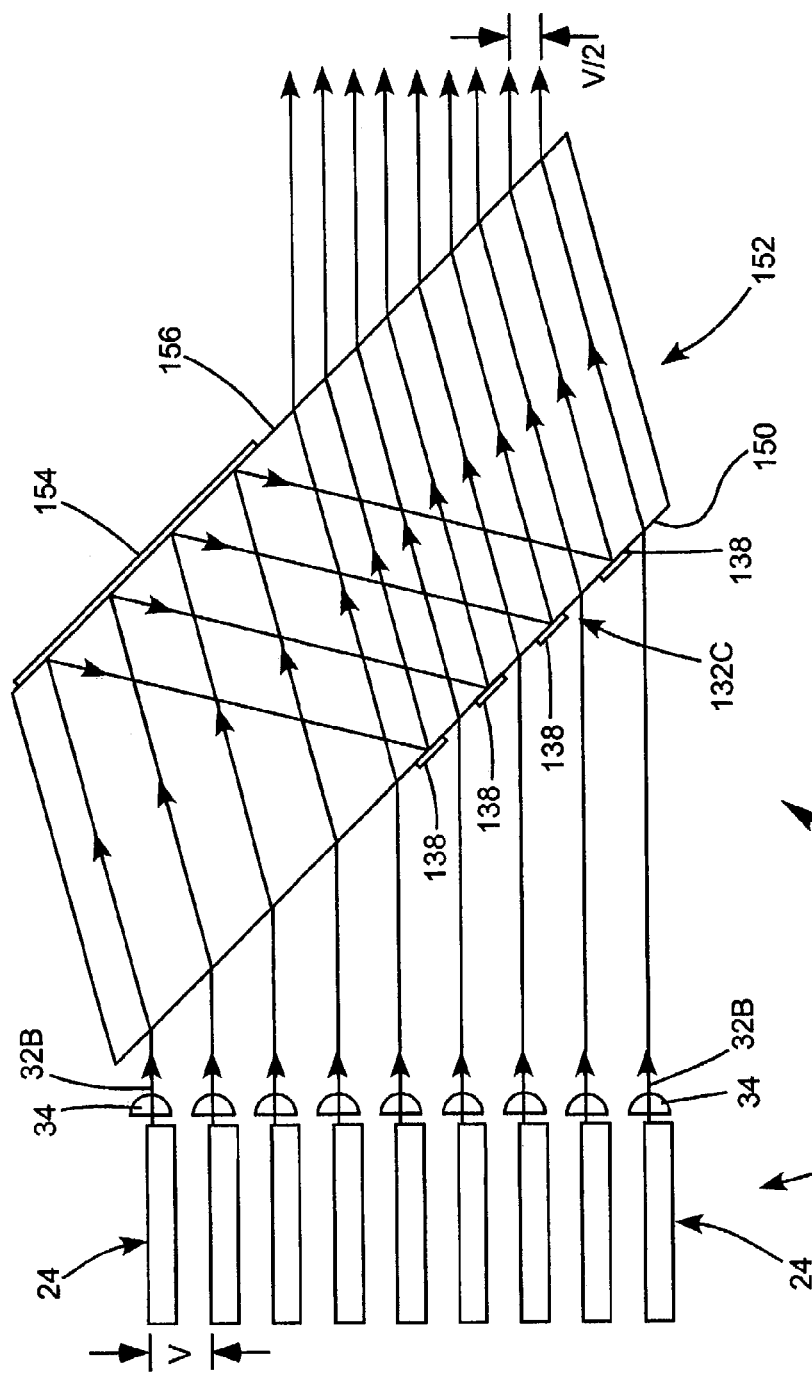
FIG. 7C is a side elevation view schematically illustrating apparatus in accordance with the present invention similar to the apparatus of FIG. 7A but wherein the beam combiner including reflective strips is supported on an entrance surface of a slab of transparent material, the slab having a mirror on a portion of a second surface parallel to the first surface.

FIG. 7C schematically illustrates a variation 130C of apparatus 130A. Here a beam combiner 132C comprising parallel, spaced-apart reflective strips 138 is formed on a lower portion of an entrance surface 150 of a slab 152 of a transparent material surface 150 defines the beam combiner plane. A reflector 154 is formed on an upper portion of an exit face 156 of slab 52. Surfaces 150 and 156 are parallel to each other and are inclined to the propagation direction of beams 32B from diode-lasers 24. Here, the angle is depicted as being 45°. This should not, however, be considered as limiting the invention. Reflective strips 138 and mirror 154 are arranged and aligned with diode-laser bars 24 such that beams from five of the diode-laser bars enter the slab 152 via surface 150, proceed directly to surface 156, and exit the slab via surface 156. Three of the beams from the five diode-laser bars pass between the strips, and the other two pass around the strips. Beams from four other of the diode laser bars also enter slab 152 via surface 150. These beams, however, are intercepted by mirror 154 and are reflected thereby onto reflective strips 138. The beams are reflected by reflective strips 138 out of slab 152 via exit face 156 thereof parallel to the beams that have been directly transmitted through the slab without being reflected by mirror 154. The five directly transmitted beams and the four twice-reflected beams leave the slab parallel to each other and spaced apart by a distance V/2.

An advantage of apparatus 130, 130A, 130B and 130C compared with other embodiments of the inventive apparatus described above is that the halving of the beam spacing from the diode-laser bar stacks is accomplished without a need to change, even once, the polarization orientation of any of the beams. All of these apparatus are operable independent of the polarization orientation of the beams. A disadvantage of apparatus 130 (FIG. 7) is that two diode-laser bar stacks must be provided, and aligning the two diode-laser bar stacks and the beam combiner may prove somewhat more difficult than aligning one diode-laser bar stack with a compound prism such as compound prism 36 of FIGS. 1 and 2. A disadvantage of apparatus 130a (FIG. 7A) is that mirror 144 and beam combiner 132A must be independently aligned. Nevertheless, providing vertically aligned, parallel beams having the same polarization orientation makes any apparatus 130, 130A, 130B, or 130C convenient to combine with an above-discussed compound prism 36A for further reducing the vertical spacing of beams, or with an above-discussed compound prism 98 for overlapping horizontally spaced beams. A description of two such combinations is set forth below with reference to FIG. 9 and FIG. 10

Figure 9:
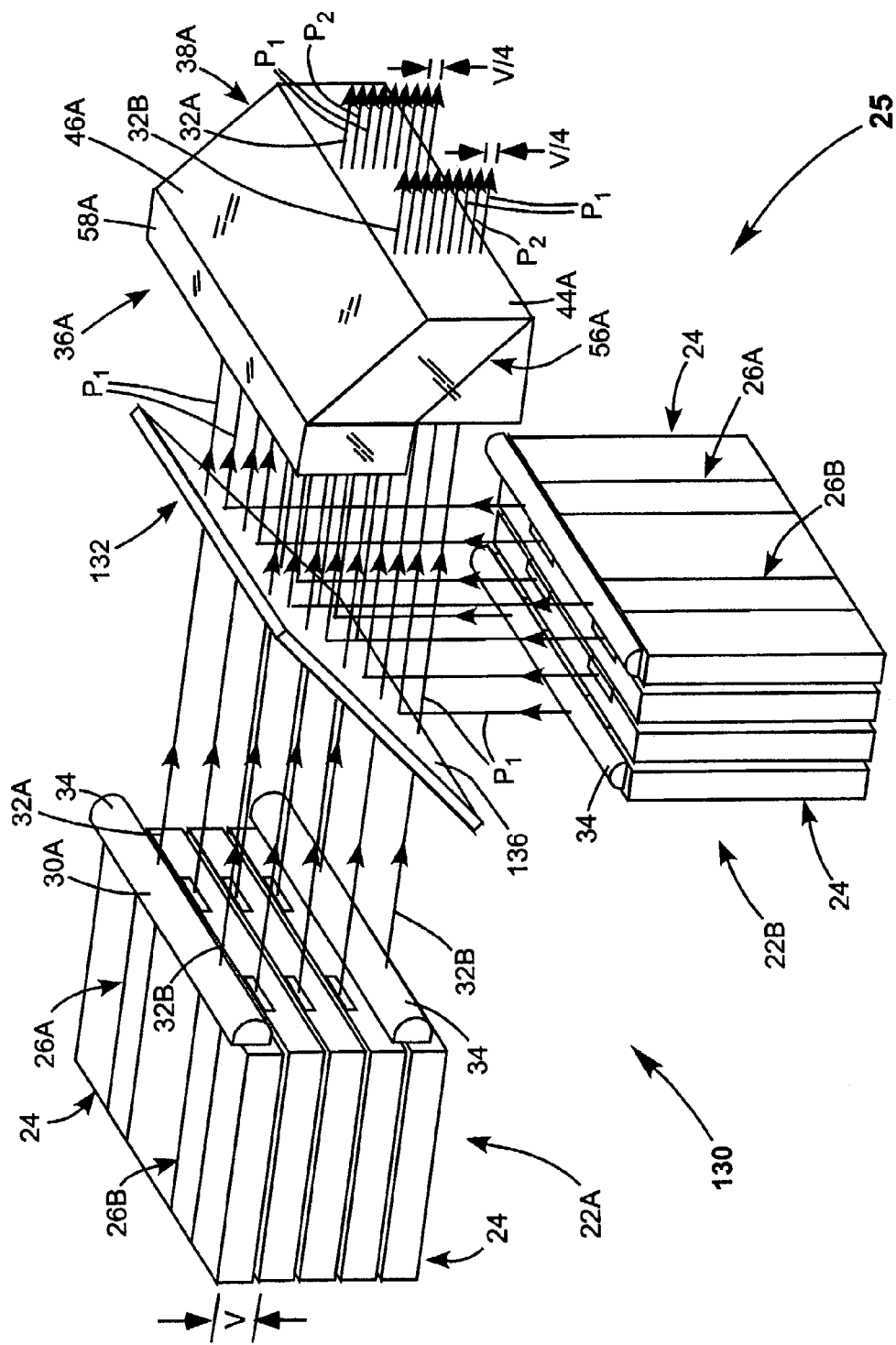
FIG. 9 is a three-dimensional view schematically illustrating a sixth embodiment of apparatus in accordance with the present invention comprising the apparatus of FIG. 7, including the two stacks of diode-laser bars having the same spacing therebetween and the beam combiner including spaced apart reflective strips, cooperative with a polarization rotator and the second compound prism of the apparatus of FIG. 4 for combining output beams from the diode-laser bars thereby forming the output beams into a parallel set of beams having a vertical spacing therebetween equal to one-quarter the spacing of the diode-laser bars.

FIG. 9 depicts a sixth embodiment 25 of apparatus in accordance with the present invention. Apparatus 25 comprises a beam combining apparatus 130 including a stack 22A of five two-emitter diode-laser bars 24, and a stack 22B of four two-emitter diode-laser bars 24. Each stack has a diode-laser bar spacing V. Each diode-laser bar 24 emits a beam-pair including beams 32A and 32B polarized in orientation $P_1$. Beam combiner 132 combines the beam-pairs from the two stacks as discussed above such that nine parallel beam-pairs polarized in orientation $P_1$ and having a vertical spacing V/2 leave beam combiner 132. The nine beam-pairs are directed to a compound prism 36A configured as described above with reference to apparatus 21 of FIG. 4.

Five of the nine parallel beam-pairs enter compound prism 36A through face 50A thereof. These five beam-pairs are transmitted through a polarization selective reflective surface 56A and exit the compound prism via face 44A thereof. The other four of the parallel beam-pairs are transmitted by a polarization rotator 58A, which rotates the polarization plane of the beam-pairs into orientation $P_2$. The $P_2$-polarized beam-pairs undergo successive reflections from face 46A and polarization selective reflective surface 56A and exit the compound prism via face 44A thereof. Dimensions and angles of the compound prism are selected such that the $P_2$-polarized beam-pairs exit face 44A midway between and parallel to the $P_1$-polarized beam-pairs as depicted. This provides nine pairs 32A and 32B of parallel beams having a vertical spacing V/4, i.e., one-quarter of the vertical spacing V of the diode-laser bars in stacks 22A and 22B thereof.

Figure 10:
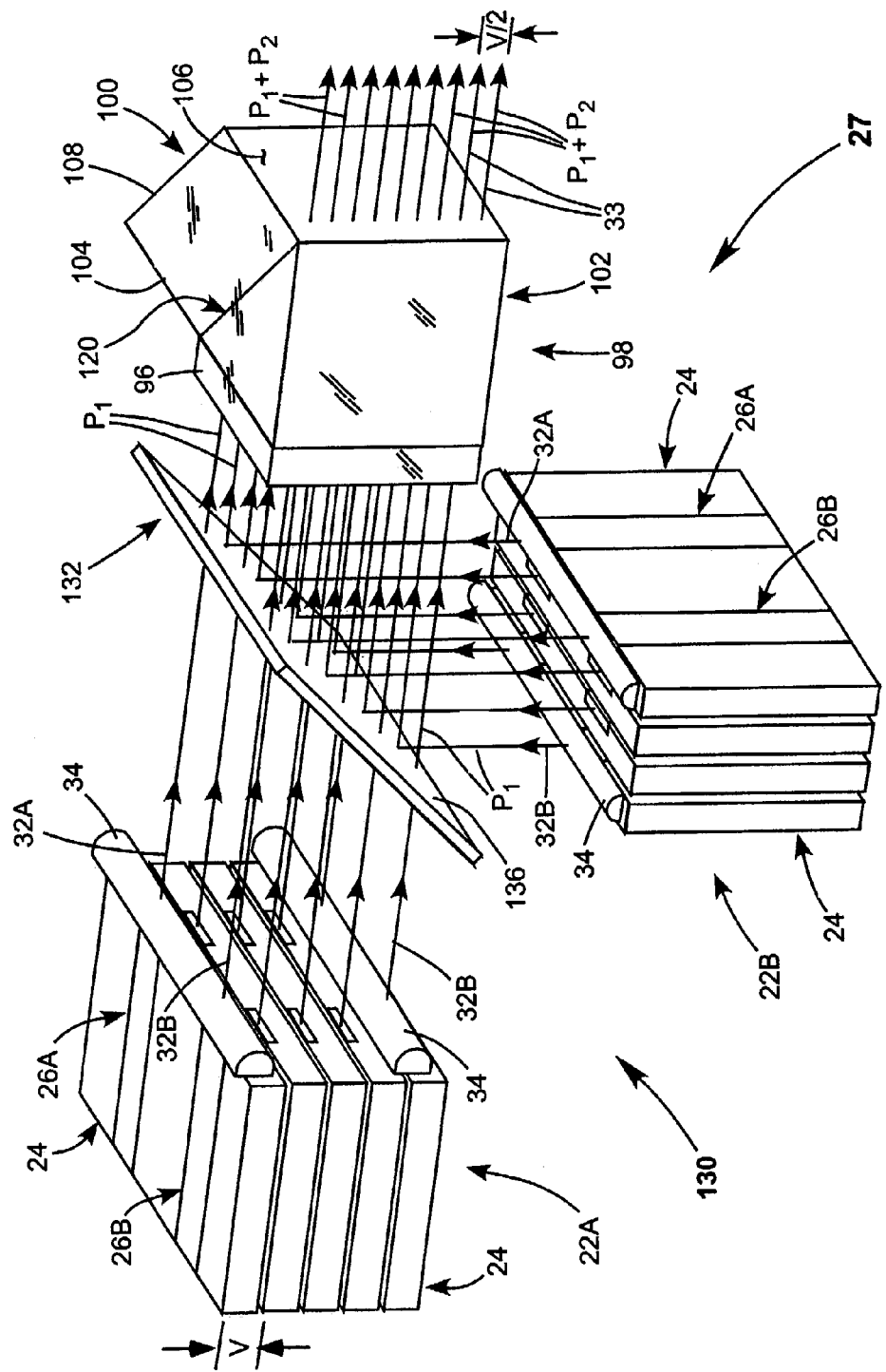
FIG. 10 is a three-dimensional view schematically illustrating a seventh embodiment of apparatus in accordance with the present invention including the apparatus of FIG. 7, including the two stacks of diode-laser bars having the same spacing therebetween and the beam combiner including spaced apart reflective strips, cooperative with a polarization rotator and the compound prism of FIG. 5 for combining output beams from the diode-laser bars and overlapping horizontally spaced ones of the combined beams.

FIG. 10 depicts a seventh embodiment 27 of apparatus in accordance with the present invention. Apparatus 27 comprises a beam combining apparatus 130 including a stack 22A of five two-emitter diode-laser bars 24, a stack 22B of four two-emitter diode-laser bars 24, and beam combiner 132. Nine beam-pairs 32A and 32B leave the beam combiner and are directed to a compound prism 98 configured as described above with reference to apparatus 23 of FIG. 6.

Each beam 32B is transmitted by polarization rotator 96, which rotates the polarization of the beam to orientation $P_2$. The $P_2$-polarized beams are transmitted through polarization selective reflecting surface 120 and exit compound prism 98 through face 106. Each beam 32A enters compound prism 98 through face 104, is sequentially reflected from face 108 and a polarization selective reflecting surface 120, and exits compound prism 98 through face 106. Dimensions and angles of the compound prism are selected such that each beam 32A exits the compound prism along the same path as, i.e., overlapped with, a corresponding beam 32B. This provides a beam 33 having both $P_1$ and $P_2$-polarized components. Accordingly apparatus 27 provides nine parallel, vertically spaced beams 33, having a vertical spacing V/2, and each having both $P_1$ and $P_2$-polarized components.

In all embodiments of the present invention discussed above, diode-laser bars have been assumed to emit light polarized in an orientation $P_1$, wherein the electric vector is parallel to the fast-axis of emitters in the diode-laser bar. Those familiar with the art will be aware that diode-laser bars that emit light polarized in orientation $P_2$ (at 90 to orientation P1), wherein the electric vector is parallel to the slow-axis of emitters in the diode-laser bar, are also commercially available. All above discussed embodiments, except apparatus 130 of FIG. 7, would require a minor reconfiguration to accommodate diode-laser bars emitting $P_2$-polarized radiation. Such a reconfiguration is discussed below with reference to FIG. 11.

Figure 11:
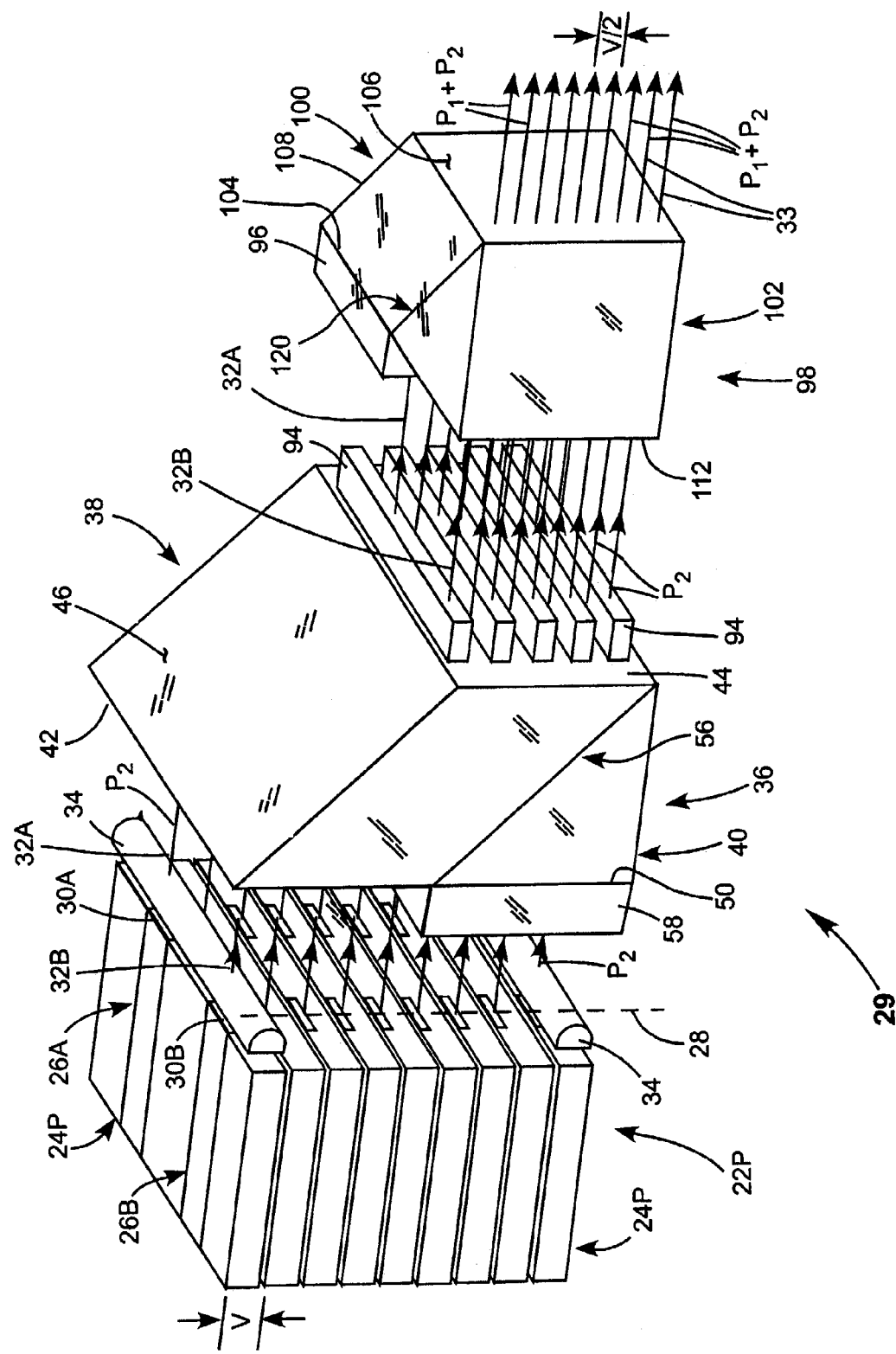
FIG. 11 is a three-dimensional view schematically illustrating an eighth embodiment of apparatus in accordance with the present invention similar to the apparatus of FIG. 6, but wherein diode-laser bars emit light that is polarized in an orientation at 90° to the polarization orientation of light emitted by the diode-laser bars of FIG. 6.

FIG. 11 schematically depicts an eighth embodiment 29 of apparatus in accordance with the present invention. Apparatus 29 is configured to achieve the same result as the apparatus 23 of FIG. 6. In apparatus 29, a diode-laser bar stack 22P including diode-laser bars 24P emitting radiation polarized in orientation $P_2$ is substituted for diode-laser bar stack 24 of apparatus 23 wherein diode-laser bars 24 emit radiation polarized in orientation $P_1$. The different polarization orientation is accommodated by changing the position of polarization rotators with respect to compound prisms, such that apparatus 29 functions as follows.

Five pairs 32A and 32B of beams polarized in orientation $P_2$ are transmitted through polarization rotator 58, which rotates the polarization orientation of the beams into orientation $P_1$. The $P_1$-polarized beams enter compound prism 36 through face 50 of triangular prism component 40 of the compound prism, are transmitted through polarization selective reflecting surface 58, and exit the compound prism via face 44 of parallelepiped prism component 38 of the compound prism.

Four beam-pairs polarized in orientation $P_2$ are reflected from face 46 of parallelepiped prism 38 and then reflected from polarization selective reflecting surface 56 of compound prism 36. After reflection from surface 56 the $P_2$-polarized beams exit compound prism 36 via face 44 of parallelepiped prism component 38 of the compound prism. The dimensions of compound prism 36 are selected, cooperative with the angles at which component prism faces are inclined, such that each $P_2$-polarized beam leaves the compound prism parallel to and midway between two $P_1$-polarized beams.

Five half-wave polarization rotators 94 are arranged spaced apart and parallel to each other, adjacent to or bonded to face 44 of parallelepiped prism 38 of compound prism 36. Polarization rotators 94 rotate the polarization of $P_1$-polarized beams to orientation $P_2$, thereby providing nine parallel beam-pairs, all polarized in orientation $P_2$, with a vertical spacing therebetween of V/2. The nine $P_2$-polarized beam-pairs are then directed to a compound prism 98.

Before reaching the compound prism, each beam 32A is transmitted by polarization rotator 96, which rotates the polarization of the beam to orientation $P_1$. The $P_1$-polarized beams then enter compound prism 98 and are sequentially reflected from face 108 and polarization selective reflecting surface 120 and exit compound prism 98 through face 106. Each beam 32B enters compound prism 98 via face 112, is transmitted through polarization selective reflecting surface 120, and exits compound prism 98 through face 106. Dimensions and angles of the compound prism are selected such that each beam 32A exits the compound prism along the same path as, i.e., overlapped with, a corresponding beam 32B. This provides nine parallel, vertically spaced beams 33, each having both $P_1$ and $P_2$-polarized components.

In one possible variation of apparatus 29, four, rather than five, polarization rotators 94 could be deployed to rotate the polarization of $P_2$-polarized beams to $P_1$-polarized beams.

This would direct nine $P_1$-polarized beam-pairs toward compound prism 98. In this case, it would be necessary to relocate polarization rotator 96 from its position adjacent face 104 of the compound prism to a position adjacent face 112 of the compound prism.

Figure 12:
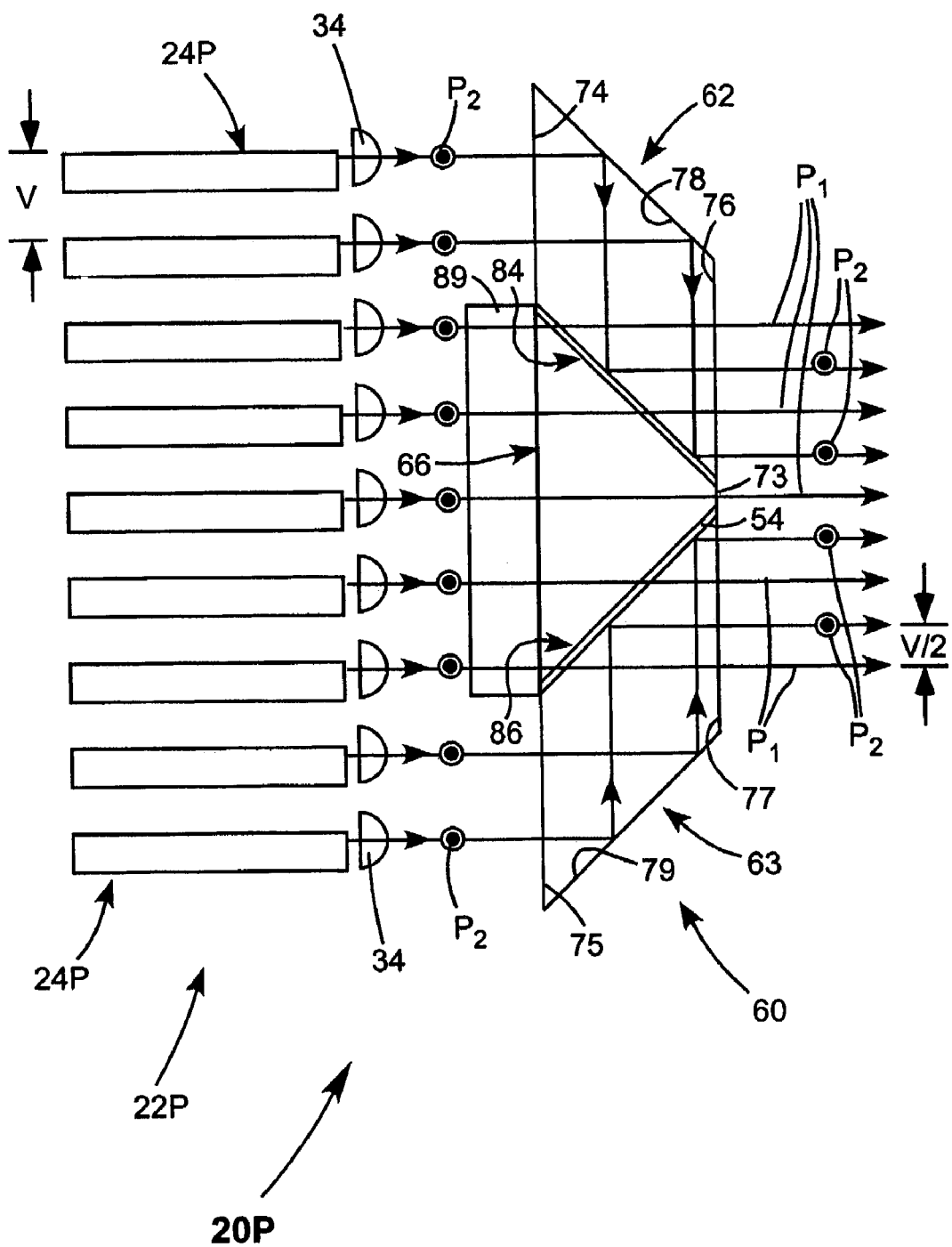
FIG. 12 is a side elevation view schematically illustrating a ninth embodiment of apparatus in accordance with the present invention, similar to the apparatus of claim 3, but wherein diode-laser bars emit light polarized in a different orientation and the apparatus includes only one polarization rotator.

FIG. 12 schematically illustrates a ninth embodiment 20P of apparatus in accordance with the present invention. Apparatus 20P is similar to apparatus 20A of FIG. 3 with an exception that diode-laser bar stack 22 is replaced by a diode-laser bar stack 22P emitting beams polarized in orientation $P_2$ as discussed above with reference to FIG. 11. Further the two polarization rotators 88 and 90 of apparatus 20A are replaced with a single polarization rotator 89 located adjacent isosceles prism component 66 of compound prism 60. Polarization rotator 89 rotates the polarization orientation of $P_2$-polarized beams to orientation $P_1$. This allows the polarization-rotated beams to be transmitted by polarization selective surfaces 84 and 86. $P_2$-polarized that are not polarization rotated are twice reflected from surfaces 78 and 84 and 79 and 86.

From the foregoing description, those skilled in the art will recognize how other above described embodiments can be reconfigured to accommodate $P_2$-polarized diode-lasers without departing from the spirit and scope of the present invention. Those skilled in the art will also recognize that all above-discussed embodiments are applicable to diode-laser bar stacks including diode-laser bars having more than two emitters. In all above discussed embodiments beams from nine diode laser bars are combined to reduce spacing, with beams from five thereof transmitted and from four thereof twice reflected. Those skilled in the art will recognize there may be more or less diode-laser bars in a stack with, generally, beams from M diode-laser bars interleaved with beams from N diode laser bars, where M may be equal to N+1 or where M and N may be equal.

In summary, the present invention is described above in terms of a preferred and other embodiments. The invention is not limited, however, to the embodiments described and depicted. Rather, the invention is limited only by the claims appended hereto.

What is claimed is:

1. A method for combining M laser-radiation beam groups with N laser radiation beam groups where M and N are integers greater than one, each of the groups including at least two beams spaced apart and parallel to each other, the M beam groups being parallel to each other and spaced apart by a distance V, and the N beam groups being parallel to each other and spaced apart by a distance V, the method comprising:

providing a beam combiner including a plurality of reflective strips in a beam combiner plane, spaced apart and parallel to each other, with transparent regions between adjacent said reflective strips;

directing said M beam groups onto said beam combiner at a first non-normal incidence angle to said beam combiner plane such that said beam groups pass through said beam combiner plane without being intercepted by said reflective strips and with one or more of said M beam groups passing through a said transparent region, said M beams exiting said beam combiner in a propagation direction; and directing said N beam groups onto said beam combiner at a second non-normal incidence angle to said beam combiner plane such that said beam groups thereof are reflected by said reflective strips, said beam groups being aligned with said beam combiner and said second non normal incidence angle being selected such that said N beam groups are reflected by said reflective strips in said propagation direction, thereby providing M+N beam groups propagating parallel to each other and spaced apart by a distance less than V wherein said reflective strips of said beam combiner are deposited on a transparent optical element having opposite surfaces parallel to each other, and wherein said first and second incidence angles are equal.

2. The method of claim 1, wherein said N beam groups are aligned with said optical element and said spacing of said reflective strips is selected such that said M+N beam groups propagate parallel to each other and spaced apart by a distance of about V/2.

3. The method of claim 1 wherein said incidence angles are equal to Brewster's angle for the material of said optical element.

4. The method of claim 1, wherein said incidence angles are about forty-five degrees.

5. The method of claim 1, wherein a reflector is provided for directing said N beam groups onto said beam combiner.

6. The method of claim 1, wherein said reflective strips are located at an optically bonded interface between a triangular prism and a parallelepiped prism.

7. The method of claim 6, wherein said N beam groups are directed onto said beam combiner via internal reflection from a face of said parallelepiped prism, and said M beam groups are directed onto said beam combiner via transmission through said triangular prism.

8. The method of claim 1, wherein said reflective strips are located at a first location on a first surface of a transparent optical element, said optical element having a second surface parallel to said first surface.

9. The method of claim 8, wherein said N beam are directed onto said reflective strips by transmitting the beam groups through said first surface at a second location thereon, and reflecting said beam groups from one or more reflectors located on said second surface at a first location thereon.

10. The method of claim 9, wherein said M+N beam groups exit said optical element via said second surface thereof at a second location thereon.

11. Apparatus, comprising:

a first stack of M diode-laser bars, each diode-laser bar emitting a group of at least two laser radiation beams spaced apart and parallel to each other, with beam groups emitted by said first stack being parallel to each other and propagating in a first propagation direction and being spaced apart by a distance V, and;

a second stack of N diode-laser bars, each diode-laser bar emitting at least two laser radiation beams spaced apart and parallel to each other with beam groups emitted by said second stack being parallel to each other and propagating in a second propagation direction and being spaced apart by a distance V;

a beam combiner defined by a unitary transparent optical element, said optical element having a plurality of reflective strips formed thereon, spaced apart and parallel to each other, such that a transparent region is defined between adjacent ones of said reflective strips, said beam combiner being arranged at first and second inclination angles to respectively said first and second propagation directions;

said first stack of diode-laser bars being aligned with said beam combiner, and spacing of the reflective strips being selected such that said beam groups emitted by said first stack of diode-laser bars are transmitted through said beam combiner without being intercepted by said reflective strips, and with at least one of said beam groups passing through a said transparent region; and said second stack of diode-laser bars being aligned with said beam combiner such that beam groups emitted thereby are intercepted by said reflective strips and reflected thereby parallel to said transmitted beam groups, and such that said transmitted and reflected beam groups form a group of M+N parallel beam groups spaced apart by a distance equal to about V/2.

12. The apparatus of claim 11, wherein said first and second incidence angles are each about forty-five degrees.

13. Apparatus, comprising:

a stack of M+N diode-laser bars, each diode-laser bar emitting a group of at least two laser radiation beams spaced apart and parallel to each other, with beam groups emitted by said diode-laser bar stack being spaced apart by a distance V, and propagating parallel to each other;

a beam combiner including a plurality of reflective strips, spaced apart and parallel to each other and arranged in a beam combiner plane, with a transparent region between adjacent ones of said reflective strips, said beam combiner plane being non-normally inclined to said beam groups;

a reflecting surface parallel to the beam combiner plane and spaced-apart therefrom; and said stack of diode-laser bars being aligned with said beam combiner and said reflecting surface, and spacing of the reflective strips and spacing of said reflecting surface and said beam combiner plane being selected such that beam groups from said M diode laser bars are transmitted through said beam combiner without being intercepted by said reflective strips or said reflective surface with at least one beam group passing through a said transparent region; and said stack of diode-laser bars being aligned with said beam combiner and said reflecting surface, and spacing of the reflective strips and spacing of said reflecting surface and said beam combiner plane being selected such that beam groups from said N diode laser bars are reflected by said reflective surface onto said reflective strips and leave said beam combiner in a direction parallel to said transmitted beam groups, and such that said transmitted and twice reflected beam groups form M+N parallel beam groups spaced apart by a distance equal to about V/2.

14. The apparatus of claim 13, wherein said inclination angle of said beam combiner plane to said beam groups is about forty-five degrees.

15. The apparatus of claim 13, wherein said reflective strips are located at an optically bonded interface between a triangular prism and a parallelepiped prism, said optically bonded interface defining said beam combiner plane.

16. The apparatus of claim 13, wherein said reflecting surface is formed by a face of said parallelepiped prism parallel to said optically bonded interface.

17. The apparatus of claim 13, wherein said reflective strips are located at a first location on a first surface of a transparent optical element, said first surface defining said beam combiner plane; wherein said optical element has a second surface parallel to said first surface, and said reflective surface is formed by a mirror coating at a second location on said second surface; wherein said second surface is further from said diode-laser bar stack than said first surface; and wherein beams from said diode laser bar stack all enter said optical element via said first surface thereof and exit said second surface via a portion of said second surface thereof not having said reflective coating thereon.

18. Apparatus, comprising:

a stack of M+N diode-laser bars, each diode-laser bar emitting a group of at least two laser radiation beams spaced apart and parallel to each other, with beam groups emitted by said diode-laser bar stack being spaced apart by a distance V, and propagating parallel to each other;

an optical element having first and second surfaces parallel to each other;

a beam combiner including a plurality of reflective strips located on a portion of said first surface of said optical element, said reflective strips being spaced apart and parallel to each other, with a transparent region between adjacent ones of said reflective strips;

a reflective coating located on a portion of said second surface; and said diode-laser bar stack, and said optical element being arranged and aligned with each other, and the spacing of said reflective strips being selected such that beam groups from said M diode laser bars are transmitted directly through said optical element without being intercepted by said reflective strips or said optical coating with at least at least one of said beam groups passing through a said transparent region;

said diode-laser bar stack, and said optical element being arranged and aligned with each other, and the spacing of said reflective strips being selected such that beam groups from said N diode-laser bars are transmitted through said first surface of said optical element then are reflected by said reflective coating onto said reflective strips and exit said optical element parallel to said transmitted beam groups, and such that said transmitted and twice reflected beam groups provide M+N beam parallel beam groups spaced apart by a distance of about V/2.

19. The apparatus of claim 18, wherein said optical element is arranged with said optical element such that said beams groups from said diode-laser bars are incident on surfaces of said optical element at a non-normal incidence angle thereto.

20. The apparatus of claim 19, wherein said incidence angle is forty-five degrees.

21. The apparatus of claim 20, wherein M=N+1.

22. The apparatus of claim 21, wherein N=4.

23. An illumination source comprising:

a vertical stack of diode emitters;

a beam combiner having an array of reflective elements spaced apart a distance equal to one-half the vertical spacing between the emitters in the stack; and a reflector for redirecting light from selected ones of the emitters to the reflective elements in the combiner such that the light from the selected ones of the emitters is reflected thereby while light emitted by the unselected emitters is transmitted by the combiner and vertically overlaps with the reflected light from the selected emitters.

24. A method for combining M laser-radiation beam groups with N laser radiation beam groups where M and N are integers greater than one, each of the groups including at least two beams spaced apart and parallel to each other, the M beam groups being parallel to each other and spaced apart by a distance V, and the N beam groups being parallel to each other and spaced apart by a distance V, the method comprising:

providing a beam combiner including a plurality of reflective strips in a beam combiner plane, spaced apart and parallel to each other, with transparent regions between adjacent said reflective strips;

directing said M beam groups onto said beam combiner at a first non-normal incidence angle to said beam combiner plane such that said beam groups pass through said beam combiner plane without being intercepted by said reflective strips and with one or more of said M beam groups passing through a said transparent region, said M beams exiting said beam combiner in a propagation direction; and directing said N beam groups onto said beam combiner at a second non-normal incidence angle to said beam combiner plane such that said beam groups thereof are reflected by said reflective strips, said beam groups being aligned with said beam combiner and said second non normal incidence angle being selected such that said N beam groups are reflected by said reflective strips in said propagation direction, thereby providing M+N beam groups propagating parallel to each other and spaced apart by a distance less than V wherein said reflective strips are located at an optically bonded interface between a triangular prism and a parallelepiped prism.

25. The method of claim 24, wherein said N beam groups are directed onto said beam combiner via internal reflection from a face of said parallelepiped prism, and said M beam groups are directed onto said beam combiner via transmission through said triangular prism.

26. A method for combining M laser-radiation beam groups with N laser radiation beam groups where M and N are integers greater than one, each of the groups including at least two beams spaced apart and parallel to each other, the M beam groups being parallel to each other and spaced apart by a distance V, and the N beam groups being parallel to each other and spaced apart by a distance V, the method comprising:

providing a beam combiner including a plurality of reflective strips in a beam combiner plane, spaced apart and parallel to each other, with transparent regions between adjacent said reflective strips;

directing said M beam groups onto said beam combiner at a first non-normal incidence angle to said beam combiner plane such that said beam groups pass through said beam combiner plane without being intercepted by said reflective strips and with one or more of said M beam groups passing through a said transparent region, said M beams exiting said beam combiner in a propagation direction; and directing said N beam groups onto said beam combiner at a second non-normal incidence angle to said beam combiner plane such that said beam groups thereof are reflected by said reflective strips, said beam groups being aligned with said beam combiner and said second non normal incidence angle being selected such that said N beam groups are reflected by said reflective strips in said propagation direction, thereby providing M+N beam groups propagating parallel to each other and spaced apart by a distance less than V wherein said reflective strips are located at a first location on a first surface of a transparent optical element, said optical element having a second surface parallel to said first surface.

27. The method of claim 26, wherein said N beam are directed onto said reflective strips by transmitting the beam groups through said first surface at a second location thereon, and reflecting said beam groups from one or more reflectors located on said second surface at a first location thereon.

28. The method of claim 27, wherein said M+N beam groups exit said optical element via said second surface thereof at a second location thereon.

* * * * *